United States Patent
Kawashima et al.

(10) Patent No.: US 9,431,468 B2
(45) Date of Patent: Aug. 30, 2016

(54) THIN-FILM SEMICONDUCTOR DEVICE, ORGANIC EL DISPLAY DEVICE, AND MANUFACTURING METHODS THEREOF

(71) Applicant: JOLED INC., Tokyo (JP)

(72) Inventors: Takahiro Kawashima, Osaka (JP); Masanori Miura, Hyogo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/408,633

(22) PCT Filed: Mar. 7, 2014

(86) PCT No.: PCT/JP2014/001303
§ 371 (c)(1),
(2) Date: Dec. 17, 2014

(87) PCT Pub. No.: WO2014/171056
PCT Pub. Date: Oct. 23, 2014

(65) Prior Publication Data
US 2015/0194475 A1    Jul. 9, 2015

(30) Foreign Application Priority Data

Apr. 19, 2013  (JP) ................. 2013-088573

(51) Int. Cl.
*H01L 29/423* (2006.01)
*H01L 27/32* (2006.01)
(Continued)

(52) U.S. Cl.
CPC ...... *H01L 27/3258* (2013.01); *H01L 21/02178* (2013.01); *H01L 21/02266* (2013.01); *H01L 21/31111* (2013.01); *H01L 21/76877* (2013.01); *H01L 21/84* (2013.01); *H01L 23/5226* (2013.01); *H01L 29/24* (2013.01); *H01L 29/66969* (2013.01); *H01L 29/7869* (2013.01); *H01L 29/78606* (2013.01);
(Continued)

(58) Field of Classification Search
CPC ................ H01L 29/42384; H01L 29/4232; H01L 29/423634; H01L 21/02178
See application file for complete search history.

(56) References Cited

U.S. PATENT DOCUMENTS 8,766,260 B2    7/2014  Kishida et al.
2007/0063211 A1    3/2007  Iwasaki
(Continued)

FOREIGN PATENT DOCUMENTS

JP    2007-073703    3/2007
JP    2010-114413    5/2010
(Continued)

OTHER PUBLICATIONS

International Search Report (ISR) in International Patent Application No. PCT/JP2014/001303, dated Apr. 8, 2014.
(Continued)

*Primary Examiner* — Jae Lee
(74) *Attorney, Agent, or Firm* — Greenblum & Bernstein, P.L.C.

(57) ABSTRACT

A thin-film semiconductor device includes a substrate, a second protection layer, and an oxide semiconductor layer between the substrate and the second protection layer. The second protection layer has provided therein at least one through-hole in which an extraction electrode is embedded, the extraction electrode being electrically connected with the oxide semiconductor layer. The second protection layer has film density of 2.80 g/cm$^3$ to 3.25 g/cm$^3$.

13 Claims, 22 Drawing Sheets

(51) Int. Cl.
*H01L 29/786* (2006.01)
*H01L 21/02* (2006.01)
*H01L 21/768* (2006.01)
*H01L 21/84* (2006.01)
*H01L 23/522* (2006.01)
*H01L 29/24* (2006.01)
*H01L 29/66* (2006.01)
*H01L 51/50* (2006.01)
*H01L 51/52* (2006.01)
*H01L 51/56* (2006.01)
*H01L 21/311* (2006.01)
*H01L 21/3213* (2006.01)
*H01L 21/465* (2006.01)

(52) U.S. Cl.
CPC ...... *H01L 51/5012* (2013.01); *H01L 51/5253* (2013.01); *H01L 51/56* (2013.01); *H01L 21/31116* (2013.01); *H01L 21/32134* (2013.01); *H01L 21/465* (2013.01); *H01L 27/3248* (2013.01); *H01L 2227/323* (2013.01); *H01L 2251/303* (2013.01); *H01L 2251/558* (2013.01); *H01L 2924/0002* (2013.01)

(56) References Cited

U.S. PATENT DOCUMENTS

| 2009/0309096 | A1 | 12/2009 | Iwasaki |
| 2011/0114947 | A1 | 5/2011 | Iwasaki |
| 2011/0180802 | A1 | 7/2011 | Morosawa et al. |
| 2011/0248270 | A1 | 10/2011 | Fukumoto et al. |
| 2012/0097639 | A1 | 4/2012 | Mitsudome |
| 2012/0112182 | A1 | 5/2012 | Ishii et al. |
| 2012/0276694 | A1* | 11/2012 | Koezuka ............. H01L 29/7869 438/151 |
| 2013/0048977 | A1 | 2/2013 | Watanabe et al. |
| 2013/0240878 | A1 | 9/2013 | Morosawa et al. |
| 2013/0256665 | A1* | 10/2013 | Takeuchi ............... H01L 29/04 257/57 |
| 2013/0256798 | A1* | 10/2013 | Kinoshita ........... H01L 29/7869 257/347 |
| 2014/0167165 | A1 | 6/2014 | Kishida et al. |

FOREIGN PATENT DOCUMENTS

| JP | 2011-222767 | 11/2011 |
| JP | 2012-099757 | 5/2012 |
| JP | 2013-065843 | 4/2013 |
| WO | 2011/004717 | 1/2011 |

OTHER PUBLICATIONS

Arai et al., "Manufacturing Issues for Oxide TFT Technolopgies for Large-Sized AMOLED Displays", SID Symposium Digest of Technical Papers, vol. 43, Issue 1, pp. 756-759 (Jun. 2012).

* cited by examiner

US 9,431,468 B2

THIN-FILM SEMICONDUCTOR DEVICE, ORGANIC EL DISPLAY DEVICE, AND MANUFACTURING METHODS THEREOF

TECHNICAL FIELD

The present invention relates to a thin-film semiconductor device including an oxide semiconductor layer, an organic electro-luminescence (EL) display device, and manufacturing methods thereof.

BACKGROUND ART

Display devices are widely used such as liquid crystal display devices and organic EL display devices. In active matrix type display devices among such display devices, a thin-film semiconductor device called a thin-film transistor (TFT) is used. A TFT includes a gate electrode, a source electrode, a drain electrode, a semiconductor layer, a gate insulating film, and so on. The semiconductor layer included in the TFT is composed of amorphous silicon or the like is used. The semiconductor layer has a channel region where moving of carriers is controlled by voltage of the gate electrode.

In recent years, because of increase in definition and frame rate of screens in active matrix type display devices, there is a demand for increase in performance of a TFT such that the TFT is electrically connected with an organic EL element in such active matrix type display devices. Against this background, research and development have been actively conducted on TFTs using, as a semiconductor layer of a TFT, oxide semiconductor such as zinc oxide (ZnO), indium gallium oxide (InGaO), and indium gallium zinc oxide (InGaZnO, IGZO) (for example, Patent Literature 1). According to a TFT using oxide semiconductor, it is possible to realize high electrical properties according to which carrier mobility is high and off-current is reduced, compared with a TFT using conventional amorphous silicon. On the other hand, in order to improve carrier mobility in silicon semiconductor, crystallization needs to be performed by heat anneal, laser anneal, or the like. However, oxide semiconductor such as IGZO even having the amorphous structure is expected to have high carrier mobility, and accordingly does not need to be crystallized. Therefore, development has been proactively proceeded on a TFT using oxide semiconductor having the amorphous structure because such a TFT can be formed through process at a low temperature around a room temperature.

Unfortunately, there has been reported that intrusion of hydrogen into an oxide semiconductor layer deteriorates film properties of the oxide semiconductor layer (Non-Patent Literature 1). Here, deterioration in film properties of the oxide semiconductor layer means that resistance of the oxide semiconductor layer decreases. This varies threshold voltage of the TFT using oxide semiconductor, and as a result the oxide semiconductor layer is made to be conductive. Furthermore, reliability decreases. Here, decrease in reliability means that the TFT cannot operate as a transistor and the TFT cannot be stably driven as a transistor in a medium and long term due to shift in threshold voltage. Note that hydrogen which intrudes into the oxide semiconductor layer is considered to be in the form of gas, atom, radical, or ion.

In response to this, as a hydrogen protection film for protecting an oxide semiconductor layer against hydrogen, there has been proposed a method of forming a hydrogen protection film composed of aluminum oxide (AlOx) or the like (Patent Literature 2).

CITATION LIST

Patent Literature

[Patent Literature 1] U.S. Patent Application Publication No. 2012/0276694 A1
[Patent Literature 2] Japanese Patent Application Publication No. 2012-099757

Non-Patent Literature

[Non-Patent Literature 1] T. Arai et. al., "Manufacturing Issues for Oxide TFT Technologies for Large-Sized AMOLED Displays", SID Symposium Digest of Technical Papers, Volume 43, Issue 1, pages 756-759, June 2012

SUMMARY OF INVENTION

Technical Problem

By the way, when hydrogen intrudes into an oxide semiconductor layer, an impurity level that is shallower than a conduction band of oxide semiconductor is formed in the oxide semiconductor layer. In the oxide semiconductor layer in which the impurity level is formed, carriers move via the impurity level. For this reason, in the case where an oxide semiconductor layer in which impurity level is formed is used for a thin-film semiconductor device, resistance of the oxide semiconductor layer is decreased and as a result threshold voltage varies as described above. Note that the thin-film semiconductor device here indicates a device that includes a semiconductor layer which is formed by a thin-film forming method. The thin-film forming method is for example a plasma Chemical Vapor Deposition (CVD) method, a sputtering method, or the like. Also, in order to suppress decrease in resistance of the oxide semiconductor layer, a thin-film semiconductor device has been used including an aluminum oxide film as a hydrogen protection film. On the other hand, it has been considered that the closer to stoichiometric composition, namely $Al_2O_3$ f aluminum oxide is, the higher hydrogen barrier properties the aluminum oxide has. Accordingly, as an aluminum oxide film for preventing an oxide semiconductor layer, it is natural to use a high-quality film that is less deficient in oxygen (film close to $Al_2O_3$).

By the way, an aluminum oxide film is used as part of an interlayer insulating film or part of a channel protection layer of a TFT. According to this structure, process needs to be performed for providing through-holes in the aluminum oxide film in order to form wirings in the TFT. However, an aluminum oxide film having higher quality is more difficult to be dry-etched or wet-etched, that is, has lower workability.

The present invention was made in view of the above problem, and aims to achieve an aluminum oxide film that is appropriate as a protection film for oxide semiconductor in order to realize a thin-film semiconductor device that is capable of suppressing decrease in resistance of an oxide semiconductor layer due to intrusion of hydrogen thereinto and exhibiting improved workability. The present invention further aims to provide a thin-film semiconductor device that is capable of suppressing decrease in resistance of an oxide semiconductor layer due to intrusion of hydrogen thereinto and exhibiting improved workability, and to provide a manufacturing method of an organic EL display device including the thin-film semiconductor device.

Solution to Problem

In order to achieve the above aim, one aspect of the present invention provides a thin-film semiconductor device comprising: a substrate; a film containing aluminum oxide; and an oxide semiconductor layer between the substrate and the film containing aluminum oxide, wherein the film containing aluminum oxide has provided therein at least one through-hole in which an extraction electrode is embedded, the extraction electrode being electrically connected with the oxide semiconductor layer, and the film containing aluminum oxide has film density of 2.80 $g/cm^3$ to 3.25 $g/cm^3$.

Advantageous Effects of Invention

The thin-film semiconductor device relating to the one aspect of the present invention includes the film containing aluminum oxide having film density of 2.80 $g/cm^3$ to 3.25 $g/cm^3$. With this configuration, it is possible to provide a thin-film semiconductor device that is capable of suppressing decrease in resistance of an oxide semiconductor layer due to intrusion of hydrogen thereinto and exhibiting improved workability. Furthermore, it is possible to provide respective manufacturing methods of the thin-film semiconductor device and an organic EL display device including the thin-film semiconductor device.

DESCRIPTION OF EMBODIMENTS

Figure 1:
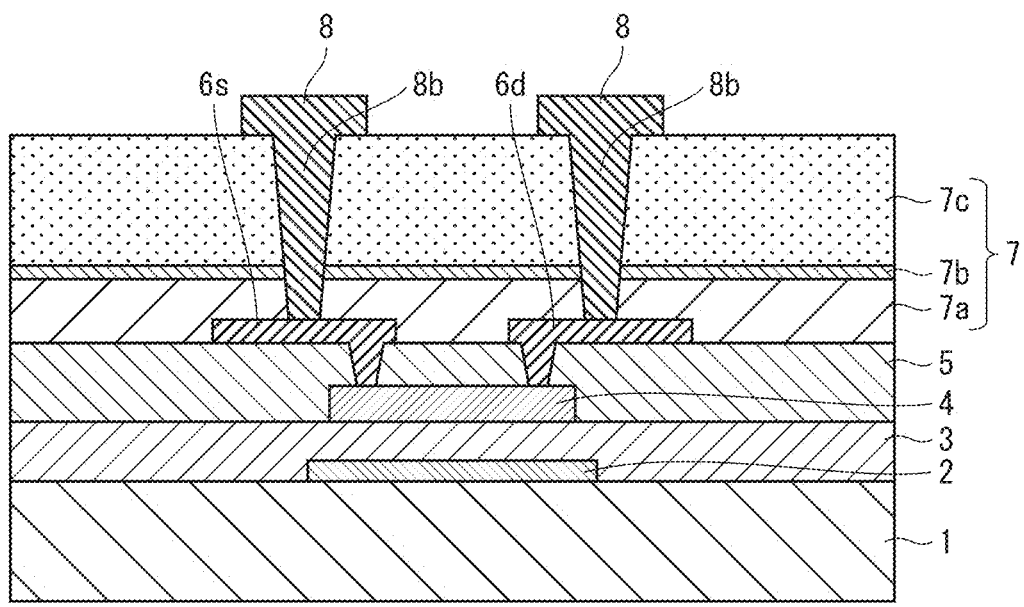
FIG. 1 is a cross-sectional view schematically showing configuration of a thin-film semiconductor device relating to Embodiment 1 of the present invention.

Outline of One Aspect of the Present Invention

The one aspect of the present invention provides a thin-film semiconductor device comprising: a substrate; a film containing aluminum oxide; and an oxide semiconductor layer between the substrate and the film containing aluminum oxide, wherein the film containing aluminum oxide has provided therein at least one through-hole in which an extraction electrode is embedded, the extraction electrode being electrically connected with the oxide semiconductor layer, and the film containing aluminum oxide has film density of 2.80 g/cm$^3$ to 3.25 g/cm$^3$.

Also, according to the thin-film semiconductor device, the film containing aluminum oxide may have film density of 2.85 g/cm$^3$ to 2.95 g/cm$^3$.

Also, according to the thin-film semiconductor device, a composition ratio x of oxygen to aluminum in the film containing aluminum oxide may satisfy $1.5<x<2.0$.

Also, according to the thin-film semiconductor device, the composition ratio x may satisfy $1.79 \leq x \leq 1.85$.

Also, according to the thin-film semiconductor device, aluminum oxide contained in the film containing aluminum oxide may have an amorphous structure.

Also, according to the thin-film semiconductor device, the film containing aluminum oxide may have refractive index of 1.58 to 1.66.

Also, according to the thin-film semiconductor device, the film containing aluminum oxide may have film thickness of 3 nm to 30 nm.

Also, according to the thin-film semiconductor device, the film containing aluminum oxide may have a single-layer structure.

Another aspect of the present invention provides an organic EL display device comprising, above the film containing aluminum oxide of the thin-film semiconductor device, an organic EL element that includes: a lower electrode that is electrically connected with the extraction electrode; a light-emitting layer containing an organic light-emitting material; and an upper electrode.

Yet another aspect of the present invention provides a manufacturing method of a thin-film semiconductor device, the manufacturing method comprising: preparing a substrate; forming an oxide semiconductor layer above the substrate; forming a film containing aluminum oxide above the oxide semiconductor layer; providing at least one through-hole in the film containing aluminum oxide; and embedding, in the through-hole provided in the film containing aluminum oxide, an extraction electrode that is to be electrically connected with the oxide semiconductor layer, wherein the film containing aluminum oxide has film density of 2.80 g/cm$^3$ to 3.25 g/cm$^3$.

A still another aspect of the present invention provides a manufacturing method of an organic EL display device, the manufacturing method comprising: preparing a substrate; forming an oxide semiconductor layer above the substrate; forming a film containing aluminum oxide above the oxide semiconductor layer; providing at least one through-hole in the film containing aluminum oxide; embedding, in the through-hole provided in the film containing aluminum oxide, an extraction electrode that is to be electrically connected with the oxide semiconductor layer, forming an organic EL element above the film containing aluminum oxide, the organic EL element including a lower electrode that is to be electrically connected with the extraction electrode, a light-emitting layer containing an organic light-emitting material, and an upper electrode, wherein the film containing aluminum oxide has film density of 2.80 g/cm$^3$ to 3.25 g/cm$^3$.

Embodiment 1

First, the following describes a thin-film semiconductor device 10 relating to the present embodiment of the present invention and a manufacturing method of the thin-film semiconductor device 10, with reference to FIG. 1 to FIG. 3C. In the following description, a TFT is used as an example of the thin-film semiconductor device 10.

<Configuration of Thin-Film Semiconductor Device 10>

FIG. 1 is a cross-sectional view schematically showing configuration of the thin-film semiconductor device 10 relating to the present embodiment of the present invention.

A thin-film semiconductor device 10 includes a substrate 1, a gate electrode 2, a gate insulating film 3, an oxide semiconductor layer 4, a channel protection layer 5, a source electrode 6*s*, a drain electrode 6*d*, a protection layer 7, and extraction electrodes 8. The thin-film semiconductor device 10 is a bottom gate type TFT having a gate electrode provided on the lower side of a channel region. Also, the thin-film semiconductor device 10 is a channel protection type TFT, which is one type of bottom gate type TFTs, having a channel protection layer formed on a semiconductor layer. The thin-film semiconductor device 10, which is a channel protection type TFT, is capable of forming a thin semiconductor layer containing a channel region. According to the thin-film semiconductor device 10, therefore, it is possible to reduce parasitic resistance due to the semiconductor layer, thereby improving on-characteristics.

The following describes in detail the constitutional elements of the thin-film semiconductor device 10 relating to the present embodiment.

<Constitutional Elements of Thin-Film Semiconductor Device 10>

(Substrate 1)

The substrate 1 is a glass substrate made of glass material such as quartz glass, non-alkali glass, and highly heat-resistant glass. In order to prevent intrusion of impurities contained in the glass substrate such as sodium and phosphorus into the oxide semiconductor layer 4, an undercoat layer may be formed on the substrate 1 using silicon nitride film (SiN$_x$), silicon oxide (SiO$_y$), silicon oxynitride film (SiO$_y$N$_x$), or the like. The undercoat layer has film thickness of approximately 100 nm to 2000 nm for example.

(Gate Electrode 2)

The gate electrode 2 is formed on the substrate 1. The gate electrode 2 has the single-layer structure or the multi-layer structure consisting of conductive material and/or alloy thereof for example. The gate electrode 2 is for example made of molybdenum (Mo), aluminum (Al), copper (Cu), tungsten (W), titanium (Ti), chrome (Cr), and/or molybdenum-tungsten (MoW). Alternatively, the gate electrode 2 may be a light-transmissive conductive film made of indium tin oxide (ITO), aluminum-doped zinc oxide (AZO), gallium-doped zinc oxide (GZO), or the like. The gate electrode 2 has film thickness of approximately 200 nm to 500 nm for example.

(Gate Insulating Film 3)

The gate insulating film 3 is formed on the gate electrode 2. According to the thin-film semiconductor device 10, the gate insulating film 3 is formed over the entire substrate 1 so as to cover the gate electrode 2. The gate insulating film 3 has the single-layer structure, the multi-layer structure, or the like consisting of silicon oxide ($SiO_y$), silicon nitride ($SiN_x$), silicon oxynitride film ($SiO_yN_x$), aluminum oxide ($AlO_z$), tantalum oxide ($TaO_w$), and/or hafnium oxide ($HfO_x$). In the case where the gate insulating film 3 has the multi-layer structure, the two-layer structure consisting of a silicon oxide film and a silicon nitride film may be employed.

Since the oxide semiconductor layer 4 is used in the thin-film semiconductor device 10, the gate insulating film 3 should preferably contain silicon oxide. This point is described below. In order to maintain excellent threshold voltage properties of a TFT, it is preferable to put an interface between the oxide semiconductor layer 4 and the gate insulating film 3 in an excellent state. By using the gate insulating film 3 containing silicon oxide, which is oxide material like the oxide semiconductor layer 4, it is possible to put the interface between the oxide semiconductor layer 4 and the gate insulating film 3 in an excellent state. The gate insulating film 3 has film thickness of 50 nm to 300 nm for example.

(Oxide Semiconductor Layer 4)

The oxide semiconductor layer 4 is a semiconductor film which is formed on the gate insulating film 3, and has a channel region. The oxide semiconductor layer 4 is for example made of oxide semiconductor including at least one of indium (In), gallium (Ga), and zinc (Zn). As such oxide semiconductor, amorphous indium gallium zinc oxide (IGZO, InGaZnO) is used for example. The oxide semiconductor layer 4 has film thickness of approximately 20 nm to 200 nm for example.

(Channel Protection Layer 5)

The channel protection layer 5 is a protection film for protecting the channel region of the oxide semiconductor layer 4, and is formed over the entire oxide semiconductor layer 4 so as to cover the oxide semiconductor layer 4. The channel protection layer functions as a channel etching stopper (CES) layer for preventing the channel region of the oxide semiconductor layer 4 from being etched during etching processing for forming the source electrode 6s and the drain electrode 6d. If an oxide semiconductor layer is damaged due to etching, an oxygen-deficient layer is formed on a surface of the oxide semiconductor layer. Since such an oxygen-deficient layer has excessively high carrier concentration, the oxide semiconductor layer, which is damaged due to etching, is made to be conductive. Since a TFT in this state does not operate as a transistor, it is effective that a TFT using oxide semiconductor should have the structure in which a channel region of an oxide semiconductor layer is not damaged due to etching.

The channel protection layer 5 for example has the single-layer structure or the multi-layer structure consisting of silicon oxide, silicon oxynitride, aluminum oxide, and/or silicon nitride. The channel protection layer 5 has film thickness of 50 nm to 500 nm for example. The lower limit of the film thickness of the channel protection layer 5 is determined by suppressing influence of margin due to channel etching and fixed charge in the channel protection layer 5. Also, the upper limit of the film thickness of the channel protection layer 5 is determined by suppressing decrease in reliability of manufacturing process due to increase in level difference. Also, the channel protection layer 5 may be an organic material layer mainly containing organic material which includes silicon, oxygen, or carbon.

(Source Electrode 6s and Drain Electrode 6d)

The source electrode 6s and the drain electrode 6d are each formed above the channel region of the oxide semiconductor layer 4 via the channel protection layer 5. Also, the source electrode 6s and the drain electrode 6d are disposed facing each other with a space therebetween, and thereby the source electrode 6s and the drain electrode 6d are electrically connected with the oxide semiconductor layer 4. In other words, when voltage is applied to the gate electrode 2, carriers move from the source electrode 6s and the drain electrode 6d to the oxide semiconductor layer 4.

According to the thin-film semiconductor device 10, the source electrode 6s and the drain electrode 6d each have the single-layer structure or the multi-layer structure consisting of conductive material and/or alloy thereof for example. The source electrode 6s and the drain electrode 6d are each for example made of aluminum, molybdenum, tungsten, copper, titanium, manganese (Mn), and/or chrome. According to the thin-film semiconductor device 10, the source electrode 6s and the drain electrode 6d each have the three-layer structure consisting of Mo/Cu/CuMn. The source electrode 6s and the drain electrode 6d each have film thickness of approximately 100 nm to 500 nm for example.

(Protection Layer 7)

The protection layer 7 is formed on the source electrode 6s and the drain electrode 6d. According to the thin-film semiconductor device 10, the protection layer 7 is formed over the entire the source electrode 6s and the drain electrode 6d so as to cover the source electrode 6s and the drain electrode 6d. The protection layer 7 has the three-layer structure consisting of a first protection layer 7a, a second protection layer 7b, and a third protection layer 7c. The first protection layer 7a should preferably be composed of a film that has high adhesion with the source electrode 6s and the drain electrode 6d and contains a small amount of hydrogen therein. Accordingly, the first protection layer 7a is for example composed of a silicon oxide film. The second protection layer 7b should preferably be a film that has barrier properties against intrusion of hydrogen into the oxide semiconductor layer 4. Accordingly, the second protection layer 7b is for example composed of an aluminum oxide film (a film containing aluminum oxide). Description will be given later on preferable physical properties of an aluminum oxide film used as the second protection layer 7b. The third protection layer 7c should preferably be a film that has barrier properties against moisture and so on and ensures workability for providing contact-holes in which the extraction electrodes 8 are to be embedded. Accordingly, the third protection layer 7c has the single-layer structure, the multi-layer structure, or the like consisting of a silicon nitride film, a silicon oxide film, and/or a silicon oxynitride film. The protection layer 7 has total film thickness of 200 nm to 1000 nm for example.

(Extraction Electrodes 8)

The extraction electrodes 8 are embedded in the contact-holes provided in the protection layer 7. Also, respective lower parts 8b of the extraction electrodes 8 are in contact with the source electrode 6s and the drain electrode 6d, and thereby the extraction electrodes 8 are electrically connected with the source electrode 6s and the drain electrode 6d. This electrically connects the oxide semiconductor layer 4 with the extraction electrodes 8. Although not shown in the figure, the thin-film semiconductor device 10 includes an extraction electrode which is electrically connected with the gate electrode 2.

<Manufacturing Method of Thin-Film Semiconductor Device 10>

The following describes a manufacturing method of the thin-film semiconductor device 10, with reference to FIG. 2A to FIG. 3C. FIG. 2A to FIG. 3C are each a cross-sectional view showing a process of the manufacturing method of the thin-film semiconductor device 10 relating to Embodiment 1 of the present invention.

(Forming Processes of Substrate 1, Gate Electrode 2, and Gate Insulating Film 3)

Figure 2A:
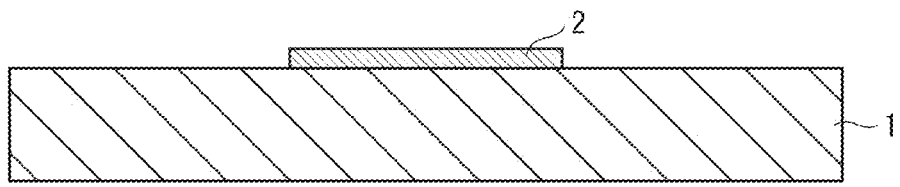
FIG. 2A to FIG. 2D are cross-sectional views schematically showing a process of forming a gate electrode, a process of forming a gate insulating film, a process of forming an oxide semiconductor layer, and a process of layering a channel protection layer material, respectively, in a manufacturing method of the thin-film semiconductor device relating to Embodiment 1 of the present invention.

First, as shown in FIG. 2A, a gate electrode is formed on a substrate 1. Specifically, a glass substrate is prepared as the substrate 1, and then the gate electrode 2 is formed on the substrate 1. The following describes in detail the forming process of the gate electrode 2.

First, a gate metal film is formed on the substrate 1 by the sputtering method. The gate metal film is composed of an Mo film and a Cu film that are layered in this order. Furthermore, the gate metal film is etched using resist, which is formed by a photolithography method, as a mask by the wet etching method. As a result, the gate electrode 2 is formed. Wet etching of the Mo film and the Cu film is performed for example with use of an etching solution containing hydrogen peroxide ($H_2O_2$) and organic acid. Note that prior to formation of the gate electrode 2, an undercoat layer may be formed on the substrate 1 by the plasma CVD method or the like, using a silicon nitride film, a silicon oxide film, a silicon oxynitride film, or the like.

Figure 2B:
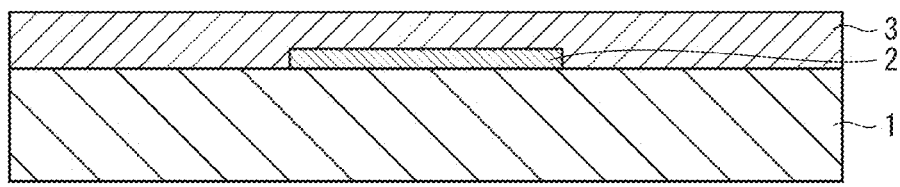

Next, as shown in FIG. 2B, a gate insulating film 3 is formed so as to cover the substrate 1 on which the gate electrode 2 is formed. For example, the gate insulating film 3 is formed by the plasma CVD method or the like so as to cover the gate electrode 2. The gate insulating film 3 is composed of a silicon nitride film and a silicon oxide film that are layered in this order. The silicon nitride film is formed for example by introducing silane ($SiH_4$) gas, ammonia ($NH_3$) gas, and nitrogen ($N_2$) gas. The silicon oxide is formed for example by introducing silane gas and nitrous oxide ($N_2O$) gas.

(Forming Processes of Oxide Semiconductor Layer 4 and Channel Protection Layer 5)

Figure 2C:
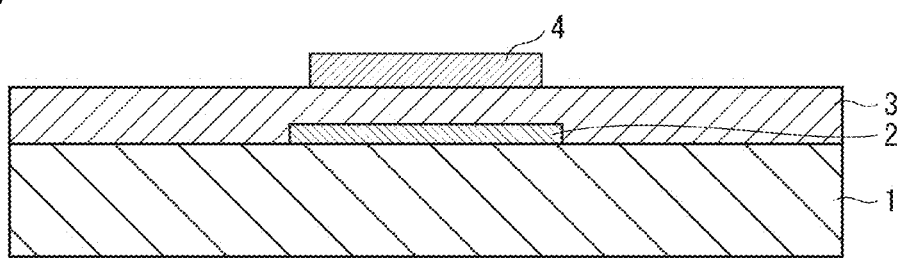

As shown in FIG. 2C, an oxide semiconductor layer 4 is formed on the gate insulating film 3. The oxide semiconductor layer 4 is for example composed of an IGZO film. Specifically, the IGZO film is formed by the sputtering method or the like. For example, an amorphous IGZO film is formed by performing sputtering on a target material with composition ratio of In:Ga:Zn=1:1:1 under an oxygen atmosphere. Furthermore, TFT properties are improved by performing thermal processing on the amorphous IGZO film at approximately 200 degrees C. to 500 degrees C. under an air atmosphere. The amorphous IGZO film is patterned by the photolithography method and the wet etching method. As a result, the oxide semiconductor layer 4 is formed. Wet etching of the IGZO film is performed for example with use of an etching solution containing phosphoric acid ($HPO_4$), nitric acid ($HNO_3$), acetic acid ($CH_3COOH$), and water.

Figure 2D:
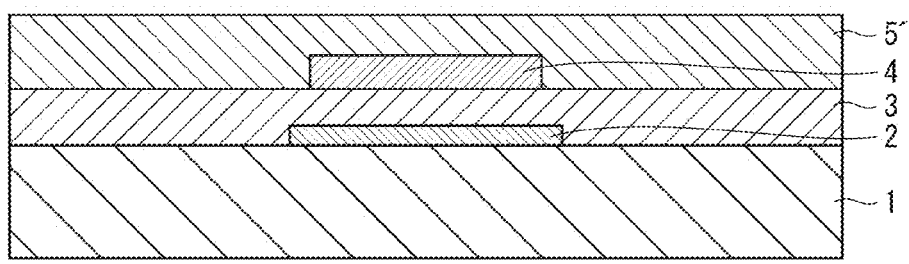

Next, as shown in FIG. 2D, a channel protection layer material 5' is layered so as to cover the oxide semiconductor layer 4. The channel protection layer material 5' is for example composed of a silicon oxide film. Specifically, a silicon oxide film is formed by the plasma CVD method or the like so as to cover the oxide semiconductor layer 4.

(Forming Process of Source Electrode 6s and Drain Electrode 6d)

Figure 3A:
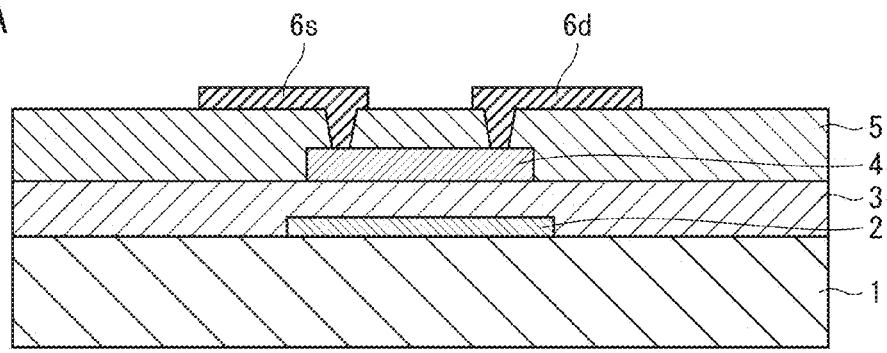
FIG. 3A to FIG. 3C are cross-sectional views schematically showing a process of forming a source electrode and a drain electrode, a process of layering a protection layer material, and a process of layering resist on the protection layer material, respectively, in the manufacturing method of the thin-film semiconductor device relating to Embodiment 1 of the present invention.

As shown in FIG. 3A, a source electrode 6s and a drain electrode 6d are formed on the channel protection layer 5.

Specifically, the channel protection layer material 5' is etched using resist, which is formed by the photolithography method, as a mask by the dry etching method. As a result, the channel protection layer 5 is formed, which has provided therein a contact hole in each of respective regions functioning as a source region and a drain region on the oxide semiconductor layer 4. Dry etching of the channel protection layer material 5', which is composed of the silicon oxide film is performed by a reactive ion etching (RIE) device for example. Etching gas used for the dry etching is for example carbon tetrafluoride ($CF_4$) gas or oxygen ($O_2$) gas. Device parameters, such as gas flow rate, pressure, electrical power to be applied, and frequency, are appropriately set in accordance with the substrate size, the set etching film thickness, and so on.

Next, the source electrode 6s and the drain electrode 6d are formed on the channel protection layer 5 in which the contact holes are provided. Specifically, a source-drain metal film is formed for example by the sputtering method on the channel protection layer 5 in which the contact holes are provided. The source-drain metal film is composed of an Mo film, a Cu film, and a CuMn film that are layered in this order. Furthermore, the source-drain metal film is etched using resist, which is formed by the photolithography method, as a mask by the wet etching method. As a result, the source electrode 6s and the drain electrode 6d are formed. Wet etching of the Mo film, the Cu film, and the CuMn film is performed for example with use of an etching solution containing hydrogen peroxide ($H_2O_2$) and organic acid.

(Forming Process of Protection Layer 7)

Figure 3B:
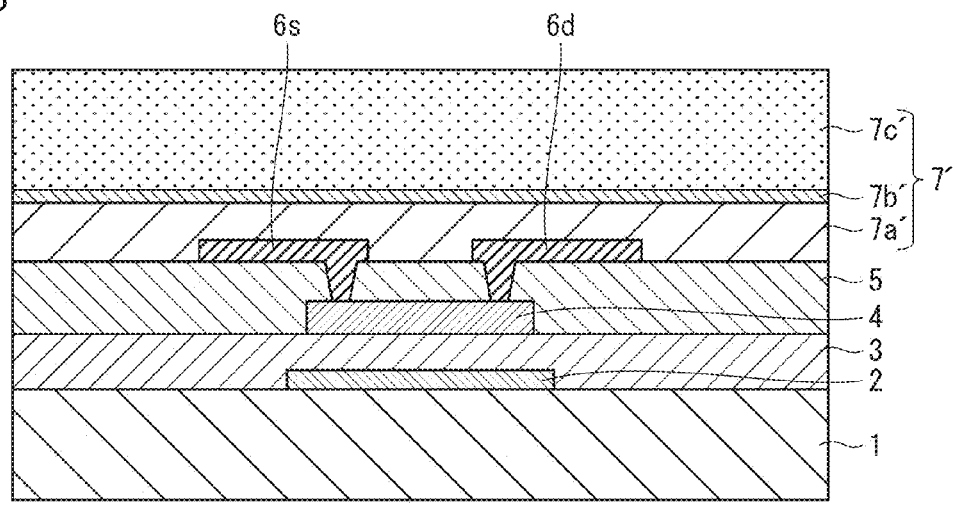

As shown in FIG. 3B, a protection layer material 7' is layered so as to cover the substrate 1 above which the source electrode 6s and the drain electrode 6d are formed. The protection layer material 7' is for example composed of a silicon oxide film, an aluminum oxide film, a silicon nitride film that are layered in this order. Specifically, the silicon oxide film constituting a first protection layer material 7a' is formed by the plasma CVD method or the like. The first protection layer material 7a' has film thickness of approximately 50 nm to 500 nm for example. The aluminum oxide film constituting a second protection layer material 7b' is layered for example by the sputtering method using a reactive sputtering device. Aluminum is used as a target, and argon (Ar) gas, oxygen ($O_2$) gas, or the like is used as process gas. Device parameters, such as gas flow rate, pressure, electrical power to be applied, and frequency, are appropriately set in accordance with the substrate size, the set film thickness, and so on. Note that aluminum oxide may be used as a target. In this case, argon gas is used as process gas. The second protection layer material 7b' has film thickness of approximately 2 nm to 50 nm for example. The silicon nitride film constituting a third protection layer material 7c' is formed by the plasma CVD or the like. The third protection layer material 7c' has film thickness of approximately 50 nm to 700 nm for example. The protection layer material 7' should preferably have total film thickness of approximately 300 nm to 700 nm in order to suppress the short between wirings and in consideration of level difference, and so on.

(Providing Process of Contact Holes in Protection Layer 7)

Figure 3C:
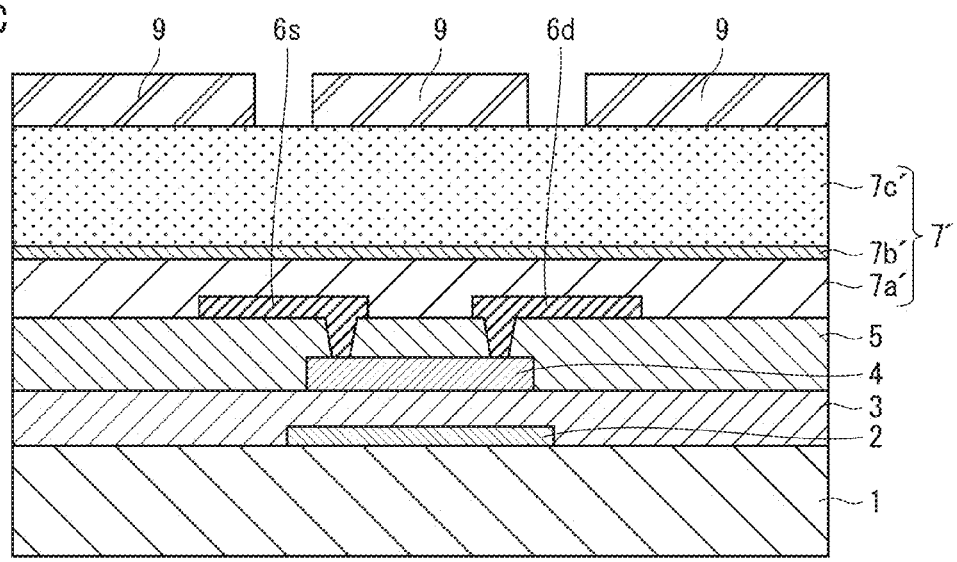

As shown in FIG. 3C, a resist 9 is layered on the protection layer material 7'. Respective parts of the resist 9 that partially cover the source electrode 6s and the drain electrode 6d each have an opening provided therein. The resist 9 is formed for example by layering resist material on the protection layer material 7' and then exposing the resist material by the photolithography method. The resist material is negative resist material, positive resist material, or the like. The resist 9 functions as a mask for use in dry etching and wet etching which are performed in processes shown below.

Figure 4A:
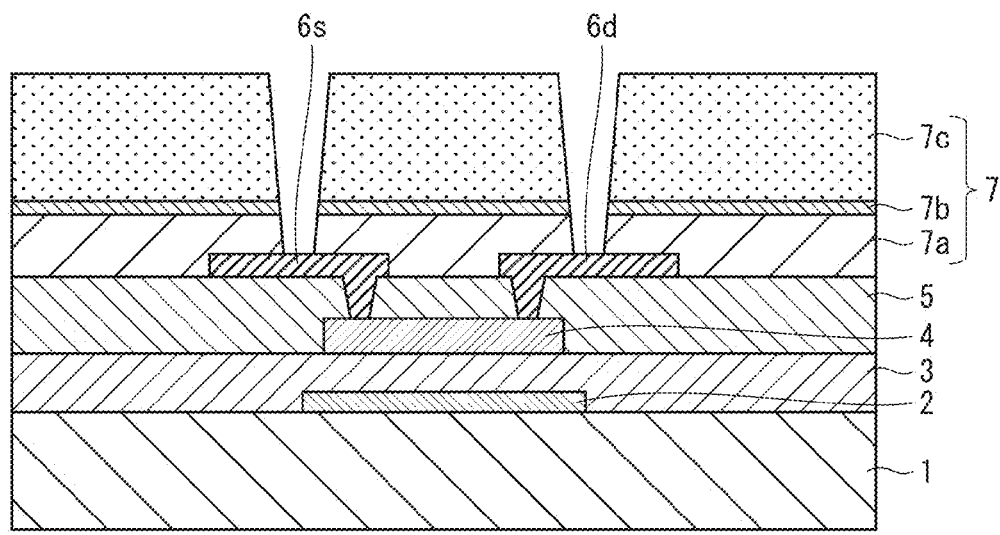
FIG. 4A and FIG. 4B are cross-sectional views schematically showing a process of forming a protection layer in which contact holes are provided and a process of forming extraction electrodes, respectively, in the manufacturing method of the thin-film semiconductor device relating to Embodiment 1 of the present invention.

Then, as shown in FIG. 4A, a protection layer 7 is formed in which contact holes are provided. The source electrode 6s and the drain electrode 6d are partially exposed through the contact holes provided in the protection layer 7. Specifically, the third protection layer material 7c' is etched by the dry etching method. Dry etching of the silicon nitride film constituting the third protection layer material 7c' is performed by the RIE device for example. Etching gas used for the dry etching is for example sulfur hexafluoride ($SF_6$) gas and oxygen ($O_2$) gas. Next, the second protection layer material 7b' is etched by the wet etching method. Wet etching of the aluminum oxide film constituting the second protection layer material 7b' is performed for example with use of an etching solution containing phosphoric acid ($HPO_4$), nitric acid ($HNO_3$), acetic acid ($CH_3COOH$), and water. Furthermore, the first protection layer material 7a' is etched by the dry etching method. Dry etching of the silicon oxide film constituting the first protection layer material 7a' is performed by the RIE device for example. Etching gas used for the dry etching is for example carbon tetrafluoride ($CF_4$) gas or oxygen ($O_2$) gas. Device parameters, such as gas flow rate, pressure, electrical power to be applied, and frequency, are appropriately set in accordance with the substrate size, the set etching film thickness, and so on.

(Forming Process of Extraction Electrodes 8)

Figure 4B:
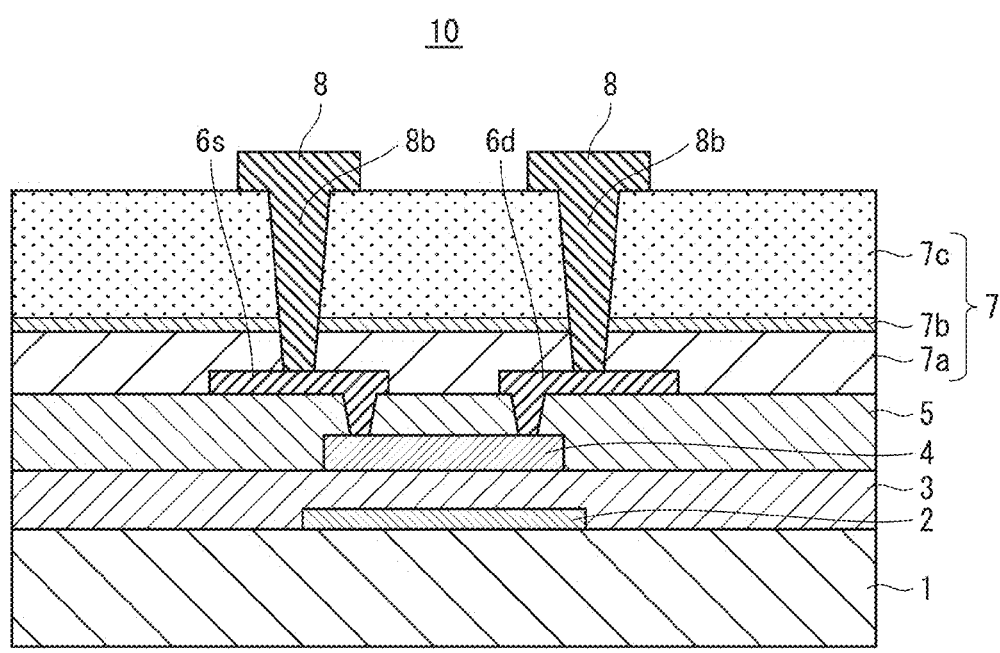

Finally, as shown in FIG. 4B, extraction electrodes 8 are formed on the protection layer 7. Specifically, an extraction metal film is formed by the sputtering method on the protection layer 7 in which the contact holes are provided. The extraction metal film is composed of an Mo film and a Cu film that are layered in this order. Furthermore, the extraction metal film is etched using resist, which is formed by the photolithography method, as a mask by the wet etching method. As a result, the extraction electrodes 8 are formed. Wet etching of the Mo film and the Cu film is performed for example with use of an etching solution containing hydrogen peroxide ($H_2O_2$) and organic acid.

Through the above processes, it is possible to manufacture the thin-film semiconductor device 10 that includes the substrate 1, the second protection layer 7b, which is a hydrogen protection film, and the oxide semiconductor layer 4, which is provided between the substrate 1 and the second protection layer 7b. In the above example, the thin-film semiconductor device 10 includes the protection layer 7 having the three-layer structure. Alternatively, the number of layers included in the protection layer 7 may be changed as long as the second protection layer is included. For example, the protection layer 7 may have the two-layer structure consisting of the first protection layer and the second protection layer, the four-layer structure including the second protection layer composed of two layers, or the like.

<Details of Structure of Second Protection Layer 7b of Thin-Film Semiconductor Device 10>

The following describes the structure of the second protection layer 7b of the thin-film semiconductor device 10, with reference to FIG. 5 to FIG. 16.

(Preferable Range of Film Density of Second Protection Layer 7b)

First, consideration is made on a preferable range of film density of the second protection layer 7b of the thin-film semiconductor device 10.

According to the thin-film semiconductor device 10, an aluminum oxide film is used as the second protection layer 7b. Here, description is given on physical properties of an aluminum oxide film that allow to realize a thin-film semiconductor device that is capable of suppressing decrease in resistance of an oxide semiconductor layer due to intrusion of hydrogen thereinto and exhibiting improved workability.

Figure 5:
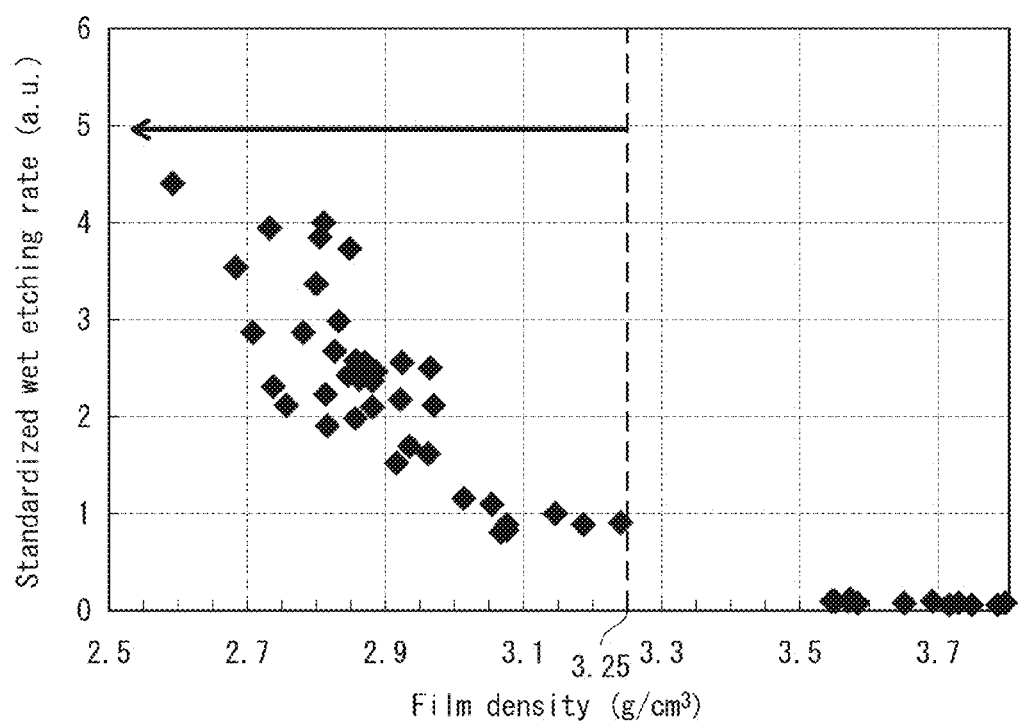
FIG. 5 shows a relation between a standardized wet etching rate of an aluminum oxide film and film density of the aluminum oxide film.

FIG. 5 shows a relation between a standardized wet etching rate of an aluminum oxide film and film density of the aluminum oxide film. Data pieces shown in FIG. 5 each correspond to any of a plurality of samples formed by various film formation methods such as an RF sputtering method, a DC sputtering method, and an EB vapor deposition method. In the case where an aluminum oxide film is formed by the sputtering method for example, a tendency is observed that as an oxygen flow rate increases, the film density decreases. In this way, the film density of an aluminum oxide film is considered to vary in accordance with film formation conditions. Also, variation tendency of the film density of the aluminum oxide film is considered to differ between the film formation methods. In the figure, the vertical axis represents a wet etching rate standardized by a wet etching rate of a reference sample, and the horizontal axis represents film density calculated from results of X-ray reflectivity (XRR) measurement.

The etching rate of the aluminum oxide film depends on the film density thereof. When the film density is 3.55 g/cm³ or more, the wet etching rate is extremely low. Accordingly, the film density of the aluminum oxide film should preferably be 3.25 g/cm³ or less according to which the wet etching rate rapidly decreases.

Here, reasons why the vertical axis represents the wet etching rate standardized by the etching rate of the reference sample are that the wet etching rate varies depending on concentration, type, and so on of an etching solution, and accordingly it is difficult to normalize the wet etching rate by describing an absolute value of the wet etching rate. In a wet etching process in which the wet etching rate of an aluminum oxide film depends on film density thereof, it is possible to obtain the same effects by adopting the film density described in the above method. Note that a wet etching rate of the reference sample in the wet etching process is approximately 1 nm/min to 50 nm/min.

Figure 6:
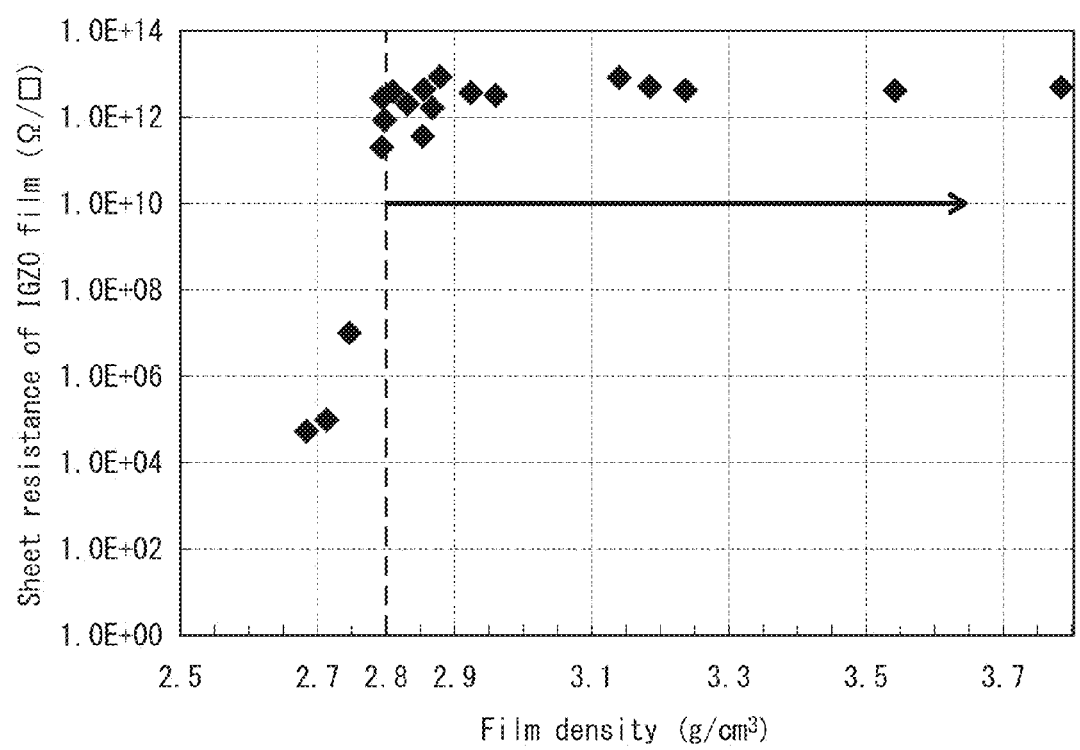
FIG. 6 shows a relation between sheet resistance of an oxide semiconductor layer and film density of an aluminum oxide film.

FIG. 6 shows a relation between sheet resistance of the oxide semiconductor layer 4 and film density of an aluminum oxide film constituting the second protection layer 7b. According to the thin-film semiconductor device 10, an IGZO film is used as the oxide semiconductor layer 4. In the figure, the vertical axis represents the sheet resistance of the IGZO film, and the horizontal axis represents film density of the aluminum oxide film. Here, the sheet resistance of the IGZO film is used as an indicator indicating hydrogen barrier properties of the aluminum oxide film. In the case where the aluminum oxide film has no hydrogen barrier properties, the IGZO film decreases in resistance as described above. In other words, the sheet resistance of the IGZO film decreases. The sheet resistance of the IGZO film was measured by forming a metal electrode pattern on the IGZO film, forming a silicon oxide film and an aluminum oxide film, and then measuring sheet resistance on a sample that includes a protection film containing hydrogen. Note that a silicon nitride film formed by a plasma CVD method is used as the protection film containing hydrogen.

When the film density of the aluminum oxide film as a second protection layer 7b is 2.80 g/cm$^3$ or less, the sheet resistance of the IGZO film rapidly decreases. In other words, when the film density of the aluminum oxide film is 2.80 g/cm$^3$ or more, the hydrogen barrier properties of the aluminum oxide film relative to the IGZO film are ensured.

Accordingly, the results shown in FIG. 5 and FIG. 6 demonstrate that the aluminum oxide film, which can ensure workability and hydrogen barrier properties of the second protection layer 7b, has the film density of 2.80 g/cm$^3$ to 3.25 g/cm$^3$. Note that an error of film density in XRR measurement is approximately 0.01 g/cm$^3$. Accordingly, the minimum of film density in consideration of the error is 2.79 g/cm$^3$ which is a result of subtraction of 0.01 g/cm$^3$ from 2.80 g/cm$^3$. Also, the maximum of film density in consideration of the error is 3.26 g/cm$^3$ which is a result of summation of 0.01 g/cm$^3$ and 3.25 g/cm$^3$. Therefore, the range of film density in consideration of the error is 2.79 g/cm$^3$ to 3.26 g/cm$^3$.

The use of the aluminum oxide film having the above film density improves formation takt time of the aluminum oxide film compared with the case where a conventional aluminum oxide film with a high quality is used. This is because film formation speed and etching rate of the aluminum oxide film having the above film density are high compared with the case where such a conventional aluminum oxide film with a high quality is formed.

(Measurement of Film Density of Second Protection Layer 7b)

Figure 7:
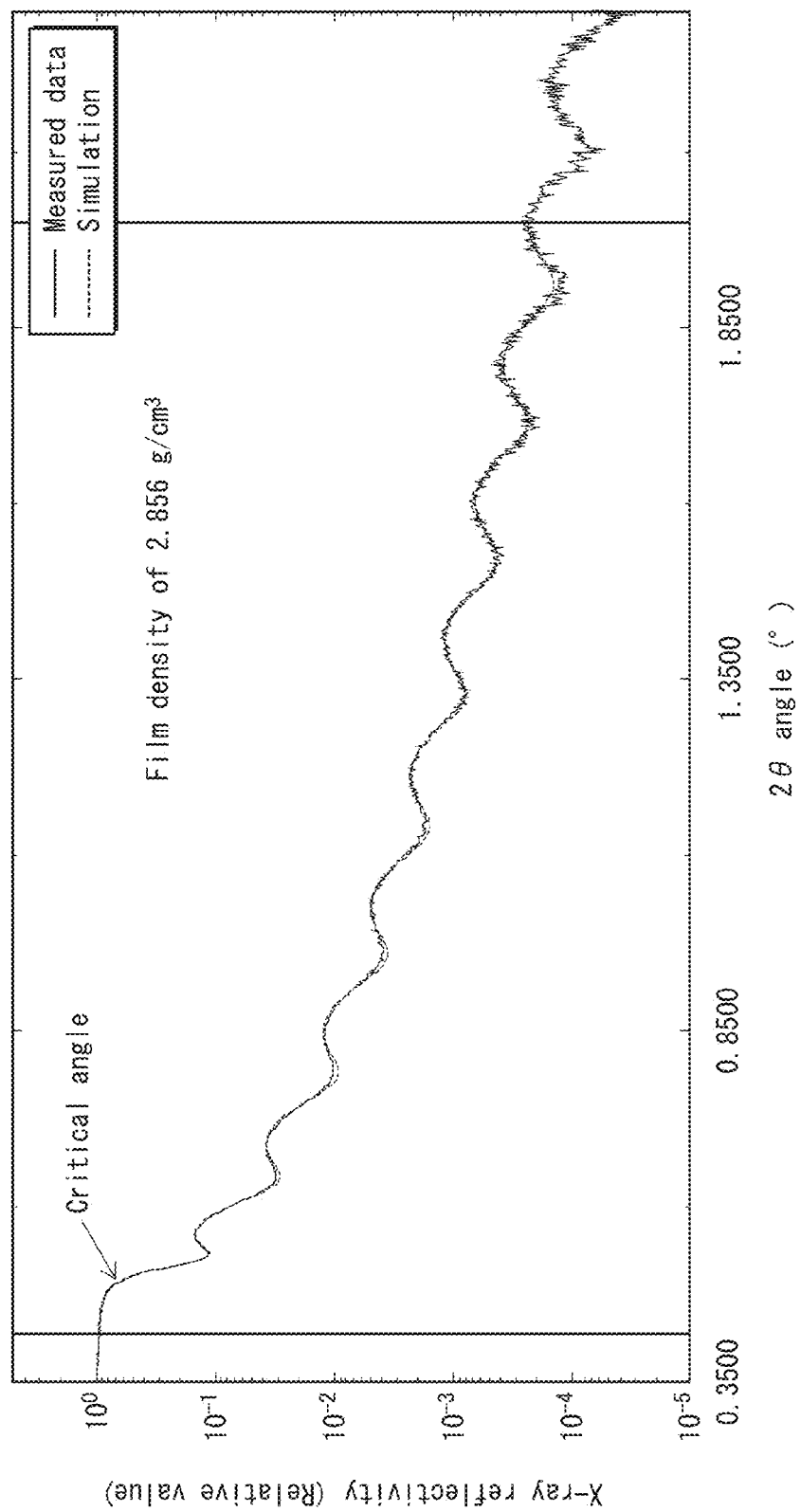
FIG. 7 shows results of X-ray reflectivity (XRR) measurement and analysis on an aluminum oxide film relating to Embodiment 1 of the present invention.

FIG. 7 shows results of XRR measurement and analysis on an aluminum oxide film constituting the second protection layer 7b of the thin-film semiconductor device 10 manufactured by the above manufacturing method. Film density of the oxidation aluminum is obtained by comparing the results of the XRR measurement with results of simulation using film density, film thickness, and surface roughness using as parameters, and optimizing the parameters for the simulation.

According to the results of the XRR measurement, the aluminum oxide film has film density of 2.856 g/cm$^3$, and this value falls within the preferable range of film density of the aluminum oxide film of 2.80 g/cm$^3$ to 3.25 g/cm$^3$.

(Optimal Range of Film Density of Second Protection Layer 7b)

By the way, in the case where the thin-film semiconductor device 10 is mass-produced, there sometimes exist errors in film formation conditions in the forming process of the second protection layer 7b. As a result of consideration on this, the present inventor proved that a degree of variation in film density of the second protection layer 7b relative to the errors in the film formation conditions differs depending on a desired value of the film density of the aluminum oxide film constituting the second protection layer 7b. Accordingly, the present inventor determined that the optimal range of the film density of the second protection layer 7b of the thin-film semiconductor device 10 is a range according to which the degree of variation in film density of the second protection layer 7b is small relative to the errors in the film formation conditions. The following specifically describes in detail the optimal range of the film density of the second protection layer 7b.

Figure 8:
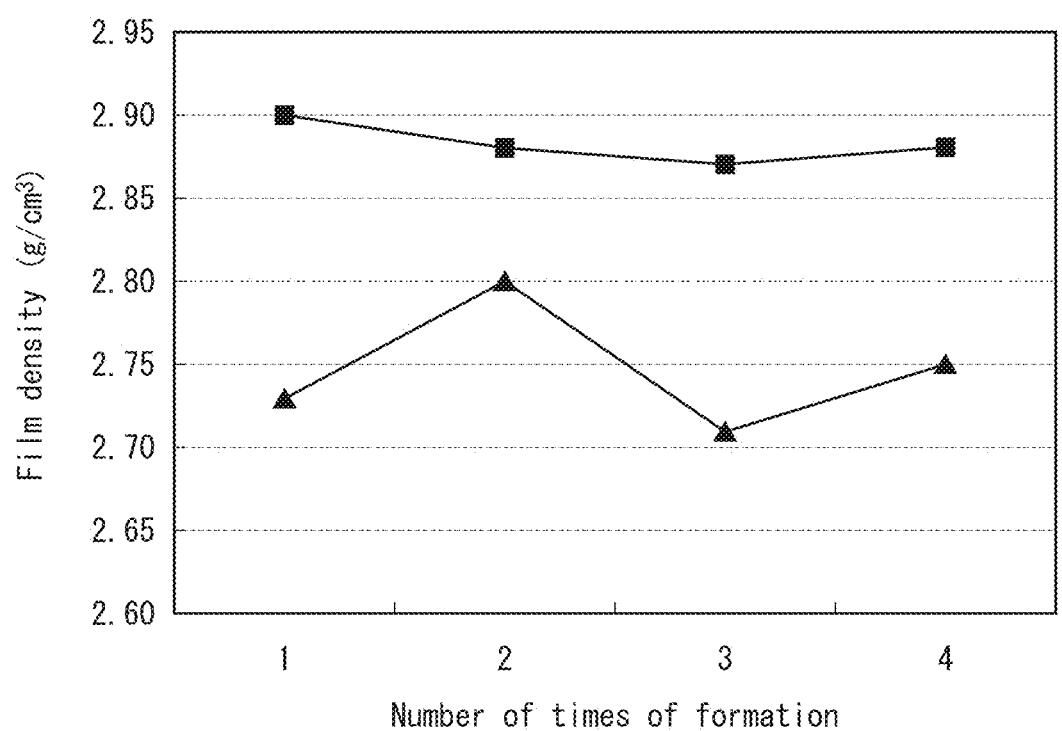
FIG. 8 shows inequality in film density of an aluminum oxide film caused by difference in the number of times of formation thereof.

FIG. 8 shows inequality in film density of an aluminum oxide film constituting the second protection layer 7b caused by difference in the number of times of formation of the aluminum oxide film. In the figure, the vertical axis represents the film density of the aluminum oxide film, and the horizontal axis represents the number of times of formation. Plots in triangle shape each correspond to the case where a desired value of the film density of the aluminum oxide film is set to 2.75 g/cm$^3$. Plots in rectangle shape each correspond to the case where a desired value of the film density of the aluminum oxide film is set to 2.90 g/cm$^3$.

As shown by the plots in triangle shape, in the case where the desired value of the film density of the aluminum oxide film is set to 2.75 g/cm$^3$, the respective film density in the first time formation, the second time formation, the third time formation, and the fourth time formation result in film density of 2.73 g/cm$^3$, 2.80 g/cm$^3$, 2.71 g/cm$^3$, and 2.75 g/cm$^3$, respectively. Accordingly, in the case where the desired value of the film density of the aluminum oxide film is set to 2.75 g/cm$^3$, inequality in film density of the aluminum oxide film between the first time formation to the fourth time formation is 0.09 g/cm$^3$. Similarly, in the case where the desired value of the film density of the aluminum oxide film is set to 2.90 g/cm$^3$, inequality in film density of the aluminum oxide film between the first time formation to the fourth time formation is 0.03 g/cm$^3$ resulting from subtraction of 2.87 g/cm$^3$ that is the minimum from 2.90 g/cm$^3$ that is the maximum. In this way, the case where the desired value of the film density is set to 2.90 g/cm$^3$ is smaller than the case where the desired value of the film density is set to 2.75 g/cm$^3$ in terms of inequality in film density of the aluminum oxide film caused by the difference in the number of times of formation. In view of reproducibility of formation of the aluminum oxide film, the desired value of the film density of the aluminum oxide film should desirably fall within the optimal range. The following considers the optimal range of the film density of the aluminum oxide film.

Figure 9:
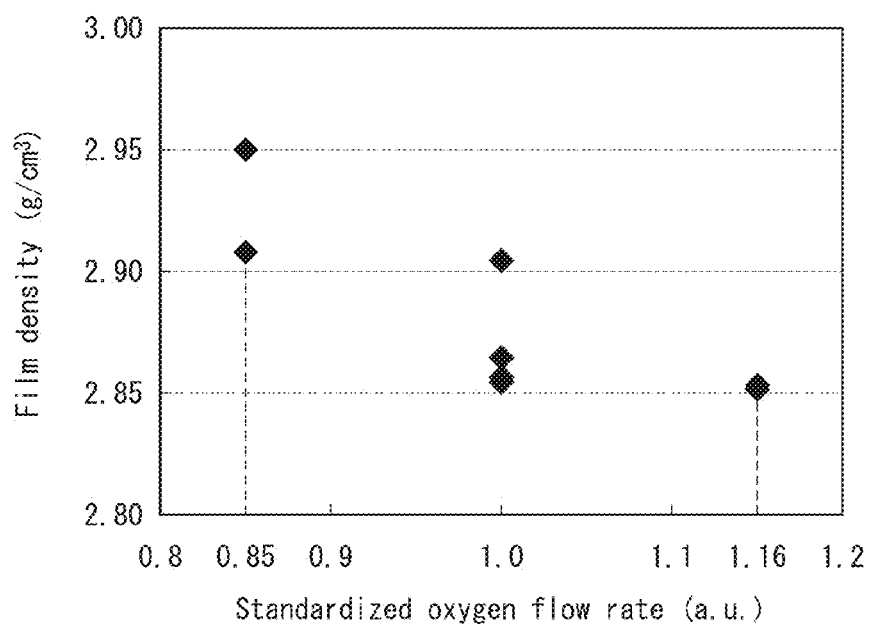
FIG. 9 shows a relation between film density of the aluminum oxide film relating to Embodiment 1 of the present invention and standardized oxygen flow rate ratio at formation of the aluminum oxide film.

FIG. 9 shows a relation between film density of the aluminum oxide film relating to Embodiment 1 of the present invention and standardized oxygen flow rate ratio at formation of the aluminum oxide film. In the figure, the vertical axis represents the film density of the aluminum oxide film, and the horizontal axis represents the standardized oxygen flow rate ratio. Here, the oxygen flow rate ratio indicates a ratio of oxygen flow rate to the total gas flow rate (the sum of argon gas flow rate and oxygen gas flow rate). Also, the standardized oxygen flow rate ratio, which is represented by the horizontal axis, indicates a ratio of center conditions to the oxygen flow rate ratio. The standardized oxygen flow rate ratio is used in order to normalize the oxygen flow rate ratio that differs depending on a film formation method, a status of the device, and so on. The oxygen flow rate ratio is actually approximately 5% to 80%.

Film density of an aluminum oxide film is influenced by oxygen flow rate ratio at formation of the aluminum oxide film. When an aluminum oxide film is formed at a small oxygen flow rate ratio, the aluminum oxide film tends to have a large film density. When the oxygen flow rate ratio varies between 0.85 and 1.16, the film density of the aluminum oxide film is 2.85 g/cm$^3$ to 2.95 g/cm$^3$.

Figure 10:
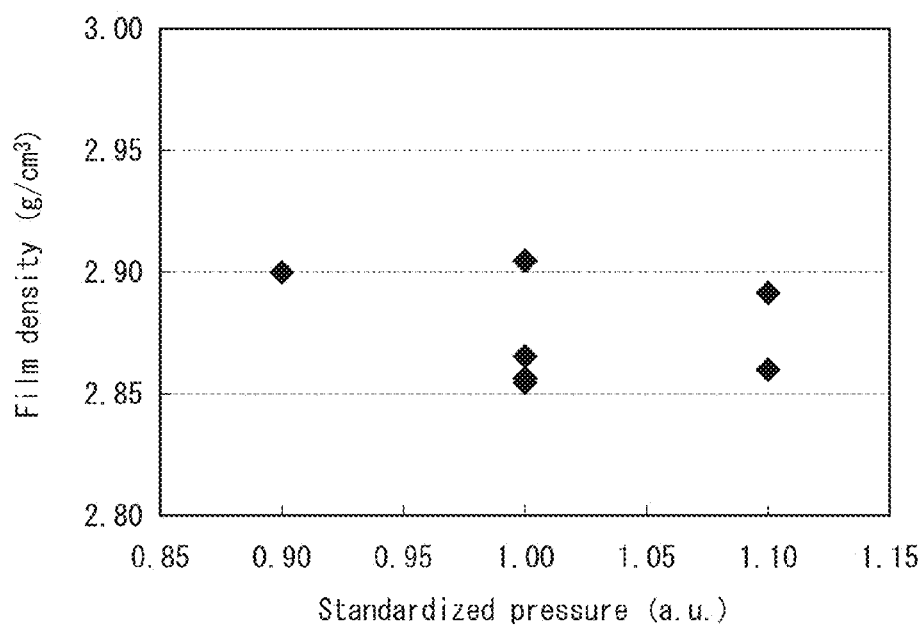
FIG. 10 shows a relation between film density of the aluminum oxide film relating to Embodiment 1 of the present invention and standardized pressure at formation of the aluminum oxide film.

FIG. 10 shows a relation between film density of an aluminum oxide film and standardized pressure at formation of the aluminum oxide film. In the figure, the vertical axis represents the film density of the aluminum oxide film, and the horizontal axis represents the standardized pressure. Here, the standardized pressure, which is represented by the horizontal axis, indicates a ratio of center conditions to pressure. The standardized pressure is used in order to normalize the pressure that differs depending on a film formation method, a status of the device, and so on, like the oxygen flow rate ratio. The pressure is actually approximately 0.2 Pa to 2.0 Pa.

As shown in FIG. 10, film density of an aluminum oxide film is influenced by pressure applied for forming the aluminum oxide film. When the pressure varies between 0.90 and 1.10, the film density of the aluminum oxide film is 2.85 g/cm$^3$ to 2.95 g/cm$^3$.

Therefore, as shown in FIG. 9 and FIG. 10, the optimal range of the film density of the aluminum oxide film should be a range of 2.85 g/cm$^3$ to 2.95 g/cm$^3$. As described above, the error in film density calculated from the results of the XRR measurements is approximately 0.01 g/cm$^3$. Accordingly, the optimal range of the film density is 2.84 g/cm$^3$ to 2.96 g/cm$^3$ in consideration of the maximum error. Even when the film formation conditions change somewhat, it is possible to form an aluminum oxide film having stable film density. This is because the aluminum oxide film is formed so as to have film density which falls within the optimal range. This decreases the inequality in film density of the aluminum oxide film caused by the difference in the number of times of formation.

(Refractive Index of Aluminum Oxide Film)

Figure 11:
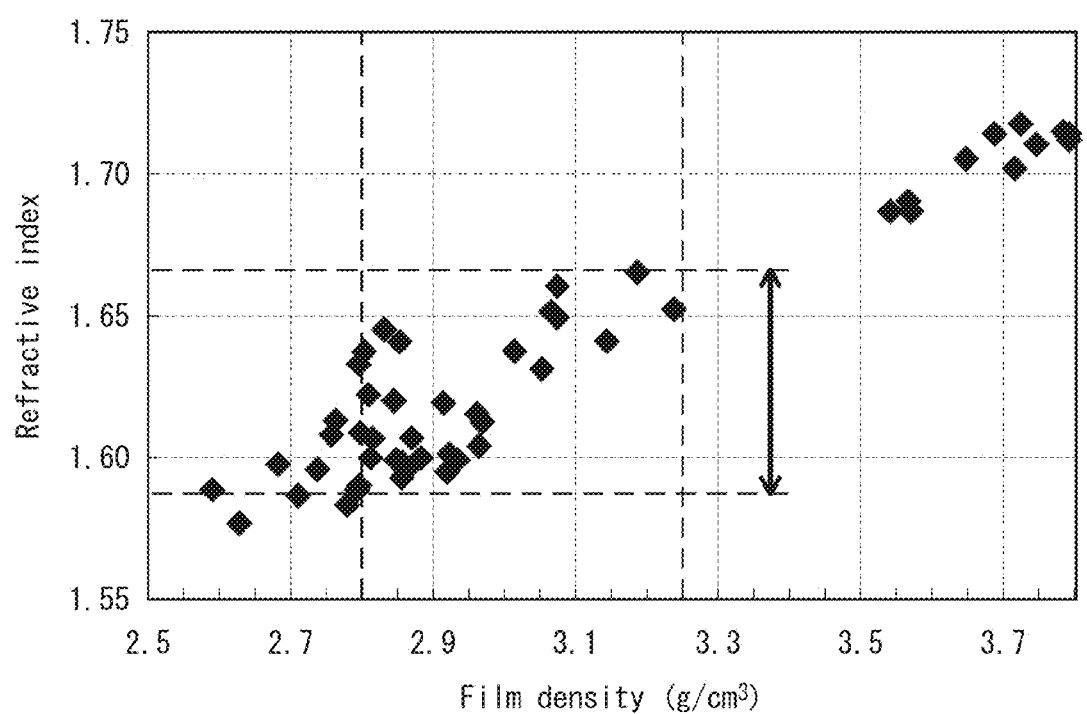
FIG. 11 shows a relation between refractive index of an aluminum oxide film and film density of the aluminum oxide film.

FIG. 11 shows a relation between refractive index of an aluminum oxide film and film density of the aluminum oxide film. Here, data pieces shown in the figure show measured values of refractive index of the samples shown in FIG. 5. Also, in the figure, the vertical axis represents the refractive index of the aluminum oxide film at wavelength of 633 nm, and the horizontal axis represents the film density of the aluminum oxide film.

A positive correlation exists between the refractive index and the film density of the aluminum oxide film. When the film density is 2.80 g/cm$^3$ to 3.25 g/cm$^3$, the refractive index should be 1.58 to 1.66 in order to ensure workability and hydrogen barrier properties.

(Film Thickness of Aluminum Oxide Film)

Figure 12:
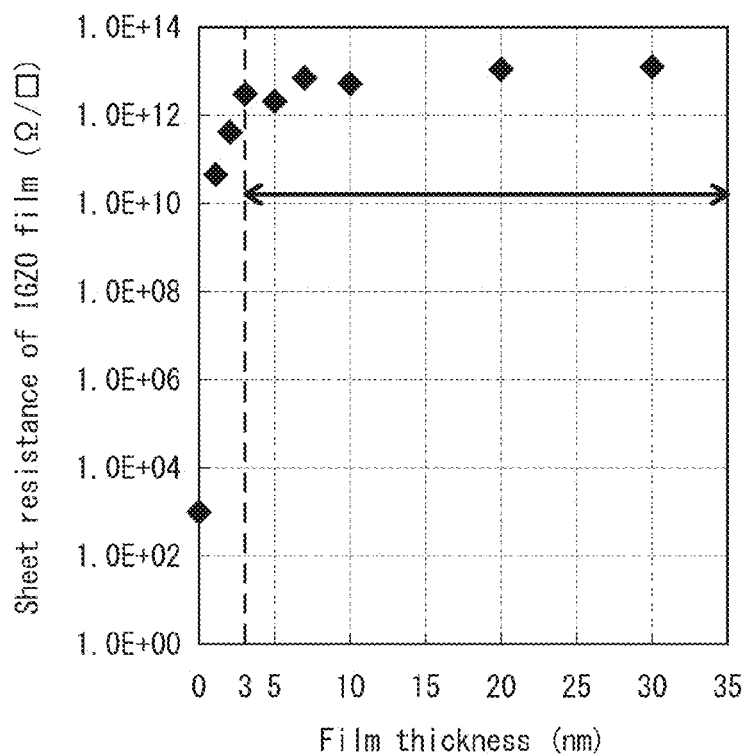
FIG. 12 shows a relation between sheet resistance of an oxide semiconductor layer and film density of an aluminum oxide film.

FIG. 12 shows a relation between sheet resistance of an IGZO film constituting the oxide semiconductor layer 4 of the thin-film semiconductor device 10 and film thickness of an aluminum oxide film. Here, the sheet resistance of the IGZO film was measured for example by forming a metal electrode pattern on the IGZO film, forming an SiO protection film and an aluminum oxide film which differ in terms of thickness from each other, and then measuring sheet resistance on a sample that includes a protection film containing hydrogen. Also, in the figure, the vertical axis represents the sheet resistance of the IGZO film, and the horizontal axis represents the film density of the aluminum oxide film.

When the film thickness of the aluminum oxide film is less than 3 nm, the sheet resistance of the IGZO film rapidly decreases. Compared with this, when the film thickness of the aluminum oxide film is 3 nm or more, the sheet resistance of the IGZO film depends little on the film thickness of the aluminum oxide film, and accordingly barrier properties of the IGZO film are ensured. Note that the film thickness of the aluminum oxide film should preferably be 30 nm or less. This is because an aluminum oxide film having film thickness of 30 nm or more is difficult to have a desired film density. For example, in the case where an aluminum oxide film is formed by the sputtering method, as film thickness of the aluminum oxide film increases, film density of the aluminum oxide film increases. For this reason, it is difficult to achieve desired workability. Also, the aluminum oxide films of the samples have the same film density that falls within the range of 2.80 g/cm$^3$ to 3.25 g/cm$^3$.

(Structure of Aluminum Oxide Film)

Figure 13:
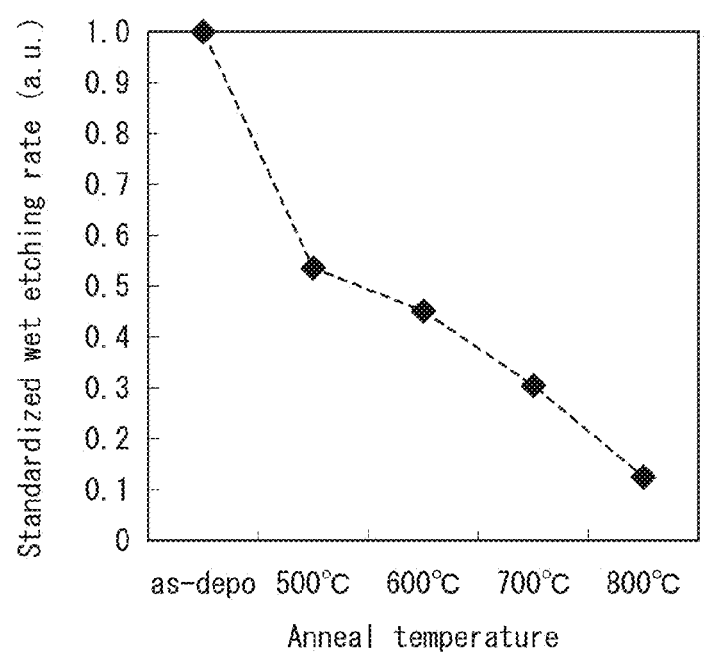
FIG. 13 shows a relation between a standardized wet etching rate of an aluminum oxide film and formation conditions of the aluminum oxide film.

FIG. 13 shows a relation between a standardized wet etching rate of the aluminum oxide film relating to Embodiment 1 and formation conditions of the aluminum oxide film. Here, the wet etching rate of the aluminum oxide film is standardized by a wet etching rate of a reference sample, in the same manner as in FIG. 5. In the figure, the vertical axis represents the standardized wet etching rate of the aluminum oxide film, and the horizontal axis represents the formation conditions of the aluminum oxide film. A sample indicated by "as-depo" is a sample which has not been annealed yet because of having been just formed, and samples indicated by "500 degrees C.", "600 degrees C.", "700 degrees C.", and "800 degrees C." indicate samples which have been annealed at corresponding anneal temperatures. The respective samples indicated by "500 degrees C.", "600 degrees C.", "700 degrees C.", and "800 degrees C." have been annealed through anneal processing for 20 minutes.

The wet etching rate of the aluminum oxide film which has not been annealed is 1.0. Also, as the anneal temperature of the aluminum oxide film increases, the wet etching rate of the aluminum oxide film decreases. Specifically, when the anneal temperature is 500 degrees C., 600 degrees C., 700 degrees C., and 800 degrees C., the wet etching rate is 0.5, 0.45, 0.3, and 0.12, respectively. It is considered that after an aluminum oxide film is annealed, aluminum oxide contained in the aluminum oxide film changes from the amorphous structure to the crystal structure. This point is considered below.

Figure 14:
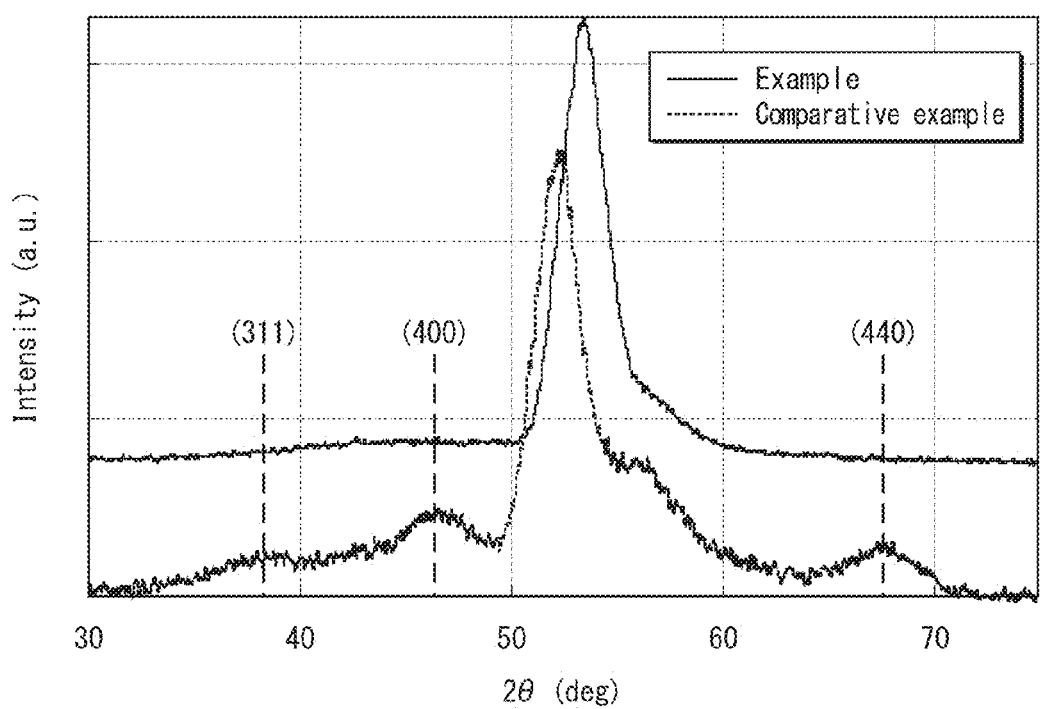
FIG. 14 shows results of X-ray diffraction (XRD) measurement made on a sample that has been annealed at 800 degrees C. (Comparative example) and a sample that has not been annealed yet (Example).

FIG. 14 shows, in dashed line, results of X-ray diffraction (XRD) measurement made on a sample which has been annealed at 800 degrees C. (Comparative example), and shows, in solid line, a sample which has not been annealed yet (Example). In the figure, the vertical axis represents standardized intensity, and the horizontal axis represents angle. In Comparative example, a diffraction peak was observed which corresponds to each of (311), (400), and (440) of aluminum oxide. This demonstrates that anneal processing at 800 degrees C. crystallizes the aluminum oxide. In Example compared with this, no diffraction peak was observed which corresponds to (311), (400), and (440) of aluminum oxide. This demonstrates that aluminum oxide contained in the aluminum oxide film which has not been annealed yet has the amorphous structure. Here, according to this amorphous structure, no crystalline diffraction peak is observed in XRD measurement. Also, it is considered that at least part of the aluminum oxide film is crystallized after having being annealed at even at 500 degrees C. to 700 degrees C. as well as at 800 degrees C.

As shown in FIG. 13, when aluminum oxide is crystallized after having been annealed, the wet etching rate rapidly decreases. Therefore, aluminum oxide contained in the aluminum oxide film constituting the second protection layer 7b of the thin-film semiconductor device 10 should preferably have the amorphous structure from a viewpoint of the workability. The aluminum oxide film that contains aluminum oxide having the amorphous structure exhibits high workability because being susceptible to intrusion of an etching solution used for wet etching compared with an aluminum oxide film that contains aluminum oxide having the crystal structure.

(Consideration)

As described above, an aluminum oxide film should have film density of 2.80 g/cm$^3$ to 3.25 g/cm$^3$ in order to ensure the workability and the hydrogen barrier properties. However, even in the case where an aluminum oxide film has film density of 2.80 g/cm$^3$ to 3.25 g/cm$^3$, properties of the aluminum oxide film differ depending on various elements. This point is considered below.

(Consideration on Refractive Index of Aluminum Oxide Film)

Film density of an aluminum oxide film is a physical amount that is just defined by quantity per unit volume. Accordingly, although the film density reflects denseness of atom of AlOx and composition ratio x, the film density basically does not reflect whether aluminum oxide contained in the aluminum oxide film has the crystal structure or the amorphous structure. It is considered that there is a case where aluminum oxide contained in one of aluminum oxide films having the same film density has the crystal structure, aluminum oxide contained in another of the aluminum oxide films has the amorphous structure. Also, it is known that an aluminum oxide film that contains aluminum oxide having the crystal structure differs in terms of refractive index from an aluminum oxide film that contains aluminum oxide having the amorphous structure. Furthermore, as described in the description of the XRD measurement, the results of the XRD measurement demonstrate that an aluminum oxide film that contains aluminum oxide having the crystal structure differs in terms of workability from an aluminum oxide film that contains aluminum oxide having the amorphous structure. Therefore, since aluminum oxide films, which have the same film density but have different refractive index, differ from each other in terms of structure (namely, whether the crystal structure or the amorphous structure), these aluminum oxide films might differ from each other in terms of workability.

In this way, it is sometimes impossible to specify an aluminum oxide film with high workability only in accordance with film density. Even in such a case, however, it is possible to specify an aluminum oxide film with high workability in accordance with refractive index in addition to the film density.

(Composition of Aluminum Oxide Film)

Figure 15:
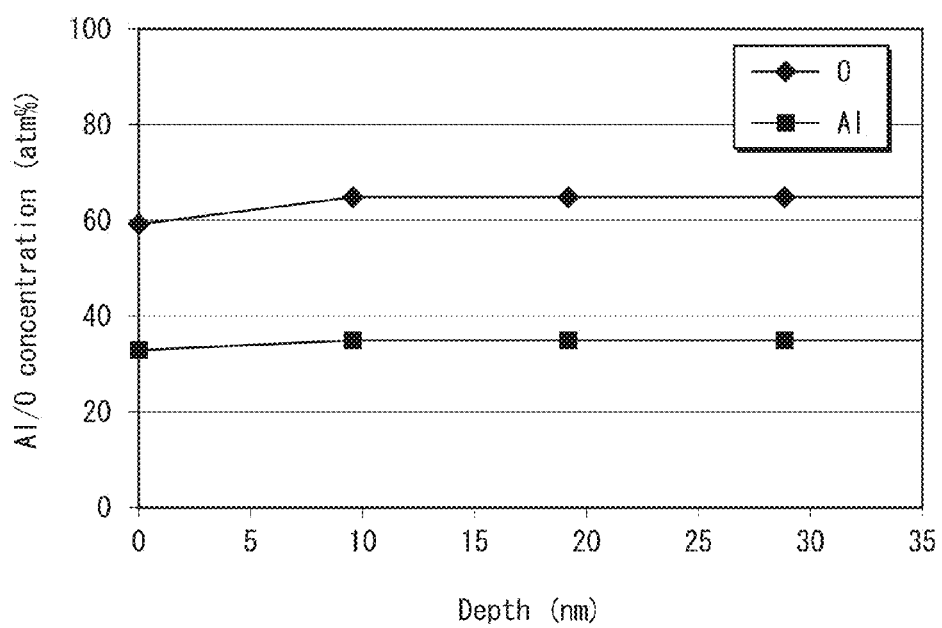
FIG. 15 shows a relation between depth in a film thickness direction and composition of the aluminum oxide film relating to Embodiment 1 of the present invention.

In order to consider the composition of AlOx contained in the aluminum oxide film relating to Embodiment 1, the aluminum oxide film was etched and spectrum measurement was made on the aluminum oxide film by an X-Ray photoelectron spectrometry (XPS). Note that the aluminum oxide film has film thickness of 35 nm. As a result of the measurement, spectrum of AlOx was obtained at depth of 0 nm, 9 nm, 19 nm, and 28.8 nm. Semi-quantitative analysis was made on each spectrum to calculate relative intensity between O and Al to obtain an atomic ratio of O contained in the aluminum oxide film and an atomic ratio of Al contained in the aluminum oxide film. FIG. 15 is a graph showing a relation between depth in a film thickness direction and composition of AlOx contained in the aluminum oxide film. In the figure, the vertical axis represents the atomic ratio of each of O and Al, and the horizontal axis represents the depth in the film thickness direction. When the depth is 0 nm, 9 nm, 19 nm, and 28.8 nm, the atomic ratio of aluminum is 32.92 atm %, 34.86 atm %, 35.02 atm %, and 35.05 atm %, respectively. That is, when the film thickness is 0 nm to 28.8 nm, the atomic ratio of aluminum is 32.92 atm % to 35.05 atm %. Also, when the depth is 0 nm, 9 nm, 19 nm, and 28.8 nm, the atomic ratio of oxygen is 58.96 atm %, 64.62 atm %, 64.50 atm %, and 64.81 atm %, respectively. That is, when the film thickness is 0 nm to 28.8 nm, the atomic ratio of oxygen is 58.96 atm % to 64.81 atm %.

The composition x of AlOx has values of 1.79 resulting from division of 58.96 by 32.92, 1.85 resulting from division of 64.62 by 34.86, 1.84 resulting from division of 64.50 by 35.02, and 1.85 resulting from division of 64.81 by 35.05. These values as the composition ratio x are each larger than 1.5 and smaller than 2.0. Furthermore, these values as the composition ratio x are each larger than 1.8 and smaller than 1.9.

It is considered that the composition ratio x is larger than 1.5 because aluminum oxide contained in the aluminum oxide film relating to Embodiment 1 has the amorphous structure as described above. AlOx having the crystal structure contained in an aluminum oxide film is Al$_2$O$_3$, and the composition ratio x is 1.5. It is considered that the aluminum oxide film relating to Embodiment 1, which contains aluminum oxide having the amorphous structure, contains a large amount of oxygen atom that is not combined with any atom, compared with an aluminum oxide film that contains aluminum oxide having the crystal structure.

It is considered that the composition ratio x is smaller than 2.0 because the realistic maximum of the composition ratio x of AlOx contained in an aluminum oxide film is 2.0.

The larger amount of oxygen atom an aluminum oxide film contains, the more easily the aluminum oxide film reacts with an etching solution for use in etching the aluminum oxide film, such as an etching solution containing phosphoric acid (HPO$_4$), nitric acid (HNO$_3$), acetic acid (CH$_3$COOH), and water. For this reason, it is possible to improve the workability of an aluminum oxide film that contains aluminum oxide having the amorphous structure better than that of an aluminum oxide film that contains aluminum oxide having the crystal structure. Therefore, it is possible to improve the workability of the aluminum oxide film relating to Embodiment 1 better than that of an aluminum oxide film having the crystal structure.

By the way, it is considered that when film density of an aluminum oxide film varies, an atomic ratio of aluminum and oxygen contained in the aluminum oxide film also varies. In the case where an aluminum oxide film has the multi-layer structure consisting of a plurality of layers having different film density, the aluminum oxide film has part where an atomic ratio of aluminum and oxygen largely varies in the film thickness direction. On the other hand, as shown in FIG. 15, the atomic ratio of aluminum oxygen contained in the aluminum oxide film relating to Embodiment 1 is substantially constant in the film thickness direction. This demonstrates that the aluminum oxide film relating to Embodiment 1 has the single-layer structure.

(Layer Structure of Aluminum Oxide Film)

Figure 16:
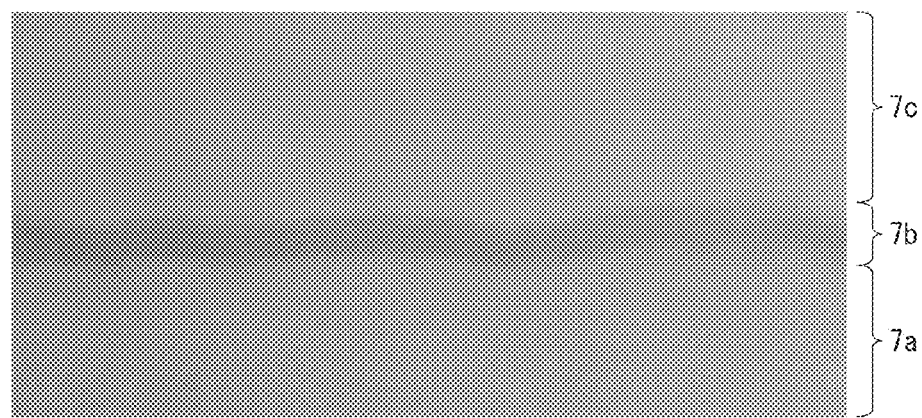
FIG. 16 shows a cross-sectional transmission electron microscope (TEM) image of a protection layer having the three-layer structure including the aluminum oxide film relating to Embodiment 1 of the present invention.

FIG. 16 shows a cross-sectional transmission electron microscope (TEM) image of a protection layer having the three-layer structure including the aluminum oxide film relating to Embodiment 1. The image shows a silicon oxide film constituting the first protection layer 7$a$, an aluminum oxide film constituting the second protection layer 7$b$, and a silicon oxide film constituting the third protection layer 7$c$. Note that the image was obtained by capturing the vicinity of the aluminum oxide film having film thickness of 30 nm. When viewed in the film thickness direction, the entire aluminum oxide film constituting the second protection layer 7$b$ is shown in constant color density with no substantial difference in color density. Generally, while an aluminum oxide film having small film density appears in low color density in a TEM image, an aluminum oxide film having large film density appears in high color density in a TEM image. Accordingly, the entire aluminum oxide film constituting the second protection layer 7b has constant film density in the film thickness direction, and therefore has the single-layer structure. By the way, an aluminum oxide film may be formed so as to have the single-layer structure consisting of a single layer having constant film density or the multi-layer structure consisting of a plurality of layers having different film density. The aluminum oxide film constituting the second protection layer 7b has the single-layer structure, and accordingly has uniform workability and hydrogen barrier properties in the film thickness direction compared with an aluminum oxide film having the multi-layer structure. Therefore, it is possible to ensure high workability of the aluminum oxide film constituting the second protection layer 7b in the film thickness direction. This allows to use a single type of etching solution for wet-etching the aluminum oxide film from the surface to the bottom so as to provide through-holes in the aluminum oxide film. Also, it is possible to ensure high hydrogen barrier properties of the aluminum oxide film constituting the second protection layer 7b in the film thickness direction. Therefore, it is possible to prevent intrusion of hydrogen into the oxide semiconductor layer.

Furthermore, if the aluminum oxide film 7b has the crystal structure, a pattern of the crystal structure appears at the same magnification as that in FIG. 16. However, since such a pattern does not appear, the aluminum oxide film 7b is considered to have the amorphous structure.

<Verification of Thin-Film Semiconductor Device>

The thin-film semiconductor device relating to Embodiment 1 of the present invention was actually manufactured, and effects thereof were verified. The following describes the configuration of the thin-film semiconductor device, using the reference signs shown in FIG. 1.

Non-alkali glass was used as the substrate 1. The gate electrode 2 was formed on the substrate 1, using a Cu film and an Mo film that are layered. Here, the Mo film functions as an adhesion layer with the substrate 1. The Cu film has film thickness of 300 nm, and the Mo film has film thickness of 20 nm.

The gate insulating film 3 was formed over the entire substrate 1 so as to cover the gate electrode 2. A silicon oxide film was used as the gate insulating film 3 which is in contact with the oxide semiconductor layer 4.

The oxide semiconductor layer 4 was formed using an amorphous indium gallium zinc oxide (IGZO) film having film thickness of 60 nm.

The channel protection layer 5 was formed using a silicon oxide film having film thickness of 200 nm.

The source electrode 6s and the drain electrode 6d were formed so as to have the three-layer structure consisting of Mo/Cu/CuMn.

The protection layer 7 was formed over the entire source electrode 6s and drain electrode 6d so as to cover the source electrode 6s and the drain electrode 6d. In the present embodiment, the protection layer 7 was formed so as to have the three-layer structure consisting of the first protection layer 7a, the second protection layer 7b, and the third protection layer 7c. The first protection layer 7a was formed using a silicon oxide film. The second protection layer 7b was formed using an aluminum oxide film having film density of 2.90 g/cm$^3$ and refractive index of 1.60. Since the film density of the aluminum oxide film is 2.80 g/cm$^3$ to 3.25 g/cm$^3$, it is possible to provide the thin-film semiconductor device 10 with improved workability. The aluminum oxide film has film thickness of 30 nm. The third protection layer 7c was formed using a silicon nitride film. The protection layer 7 can have total film thickness of 600 nm.

Figure 17:
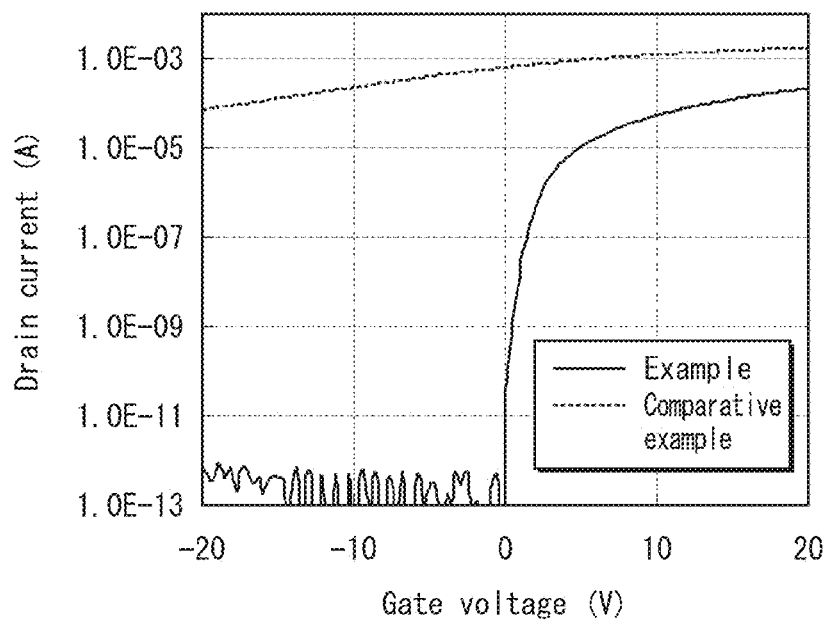
FIG. 17 shows transfer characteristics of a TFT.

FIG. 17 shows, in solid line, transfer characteristics of the TFT in the thin-film semiconductor device 10 having the above configuration, and shows, in dashed line, transfer characteristics of a TFT that does not include an aluminum oxide film as a protection film as Comparative example. In the figure, the vertical axis represents drain current, and the horizontal axis represents gate voltage.

In Comparative example (the case where an aluminum oxide film was not formed as a protection film), even when the gate voltage was decreased, the drain current did not decrease sufficiently. That is, low on-off characteristics of the transistor was observed. It is considered that an oxide semiconductor layer of Comparative example was made to be conductive in a range of the measured gate voltage. Compared with this, in Example (the case where an aluminum oxide film was formed as a protection film), when the gate voltage is decreased, the drain current decreases sufficiently. That is, high on-off characteristics of the transistor was observed. Therefore, the use of aluminum oxide for a protection film as the second protection layer 7b of the thin-film semiconductor device 10 suppressed the decrease in resistance of the IGZO film constituting the oxide semiconductor layer due to intrusion of hydrogen. This allows to prevent intrusion of hydrogen into the oxide semiconductor layer 4 of the thin-film semiconductor device 10.

Embodiment 2

The following describes a thin-film semiconductor device 20 relating to Embodiment 2 of the present invention and a manufacturing method of the thin-film semiconductor device 20.

<Configuration of Thin-Film Semiconductor Device 20>

Figure 18:
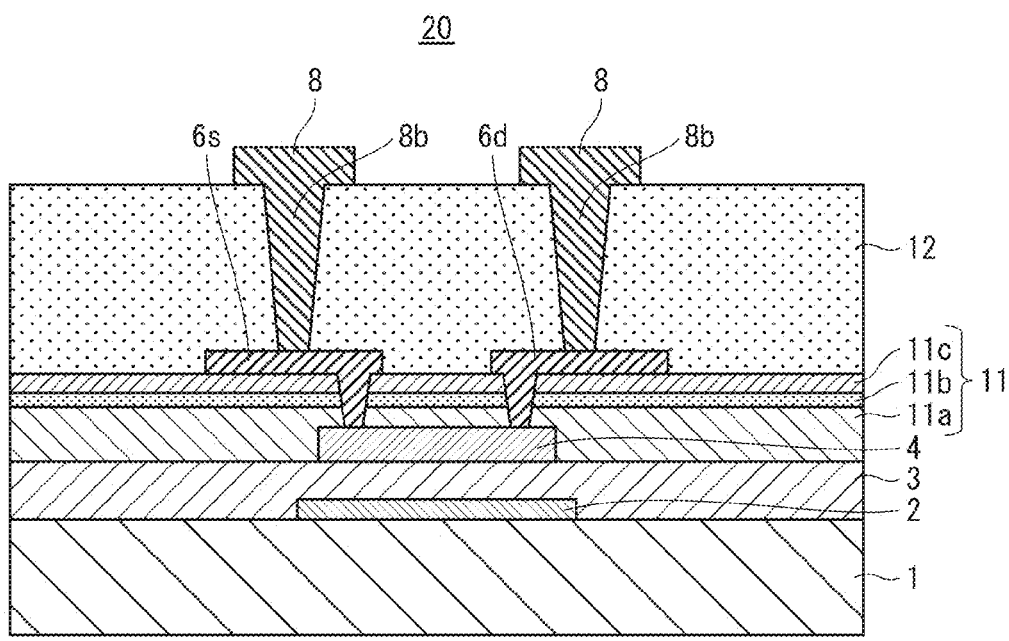
FIG. 18 is a cross-sectional view schematically showing configuration of a thin-film semiconductor device relating to Embodiment 2 of the present invention.

FIG. 18 is a cross-sectional view schematically showing configuration of the thin-film semiconductor device 20. In Embodiment 2, a channel protection layer 11 includes a protection layer 11b provided as a barrier against hydrogen, and this is difference from Embodiment 1. The protection layer 11b is composed of an aluminum oxide film like the second protection layer 7b included in the thin-film semiconductor device 10. In the figure, the compositional elements that are the same as the compositional elements in FIG. 1 have the same reference signs.

As shown in FIG. 18, the thin-film semiconductor device 20 includes the channel protection layer 11 and a protection layer 12. The thin-film semiconductor device 20 is a bottom gate type TFT.

The following describes in detail the difference between the thin-film semiconductor device 20 and the thin-film semiconductor device 10, namely the channel protection layer 11 and the protection layer 12.

The channel protection layer 11 is a protection film for protecting a channel region of an oxide semiconductor layer 4, and is formed over the entire oxide semiconductor layer 4 so as to cover the oxide semiconductor layer 4. According to the thin-film semiconductor device 20, the channel protection layer 11 has the three-layer structure consisting of a first channel protection layer 11a, a second channel protection layer 11b, and a third channel protection layer 11c. The first channel protection layer 11a should preferably be composed of a film that has high adhesion with the oxide semiconductor layer 4 and does not exercise an influence on film quality of the oxide semiconductor layer 4 (a film that contains therein a small amount of hydrogen and a large amount of oxygen). Accordingly, the first channel protection layer 11a is for example composed of a silicon oxide film. The second channel protection layer 11b should preferably be composed of a film that has barrier properties against intrusion of hydrogen into the oxide semiconductor layer 4. Accordingly, the second channel protection layer 11b is for example composed of an aluminum oxide film. The aluminum oxide film used as the second channel protection layer 11b should preferably have the above film density. The third channel protection layer 11c should be preferably composed of a film that has high adhesion with the source electrode 6s and the drain electrode 6d. Accordingly, the third channel protection layer 11c is for example composed of a silicon nitride film, a silicon oxide film, and/or a silicon oxynitride film. The channel protection layer 11 has total film thickness of 50 nm to 300 nm for example.

The protection layer 12 is formed on the source electrode 6s and the drain electrode 6d. According to the thin-film semiconductor device 20, the protection layer 12 is formed over the entire the source electrode 6s and the drain electrode 6d so as to cover the source electrode 6s and the drain electrode 6d. According to the thin-film semiconductor device 20, the protection layer 12 should be preferably composed of a film that has high adhesion with the source electrode 6s and the drain electrode 6d and has barrier properties against moisture and so on. Accordingly, the protection layer 12 has for example the single-layer structure, the multi-layer structure, or the like consisting of a silicon nitride film, a silicon oxide film, and/or a silicon oxynitride film. The protection layer 12 has total film thickness of 200 nm to 1000 nm for example.

<Manufacturing Method of Thin-Film Semiconductor Device 20>

The following describes a manufacturing method of the thin-film semiconductor device 20 relating to Embodiment 2 of the present invention with reference to FIG. 19A to FIG. 21C. FIG. 19A to FIG. 21C are each a cross-sectional view showing a process of the manufacturing method of the thin-film semiconductor device 20.

Figure 19A:
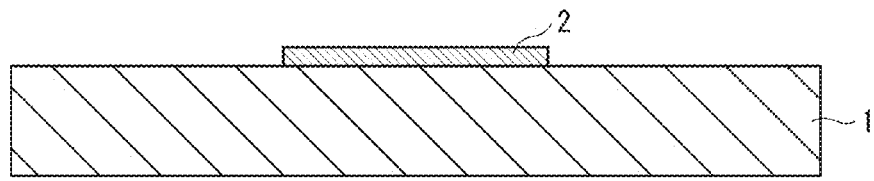
FIG. 19A to FIG. 19D are cross-sectional views schematically showing a process of forming a gate electrode, a process of forming a gate insulating film, a process of forming an oxide semiconductor layer, and a process of forming a channel protection layer material, respectively, in a manufacturing method of the thin-film semiconductor device relating to Embodiment 2 of the present invention.
Figure 19B:
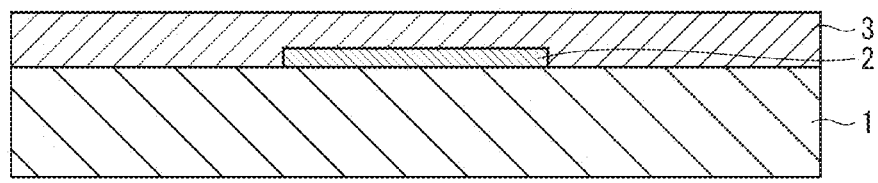
Figure 19C:
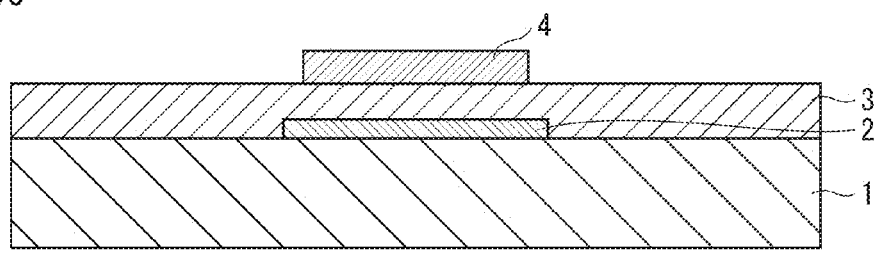

First, as shown in FIG. 19A to FIG. 19C, the following processes are performed in the same manner as in FIG. 2A to FIG. 2C. A glass substrate is prepared as a substrate 1, and a gate electrode 2 is formed on the substrate 1 (FIG. 19A). A gate insulating film 3 is formed so as to cover the gate electrode 2 (FIG. 19B). An oxide semiconductor layer 4 that is composed of an IGZO film or the like is formed on the gate insulating film 3 (FIG. 19C).

Figure 19D:
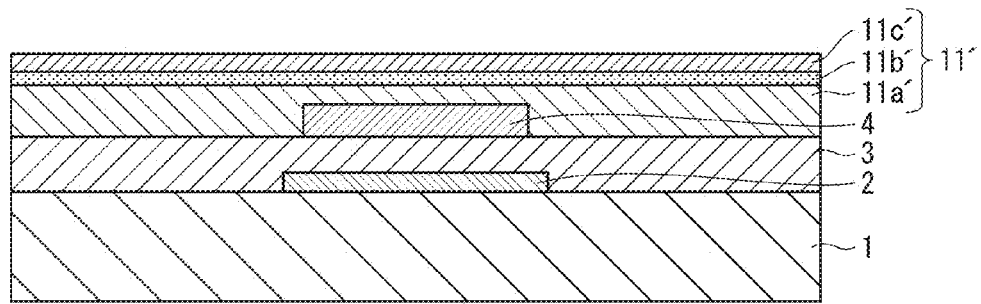

As shown in FIG. 19D, a channel protection layer material 11' is formed so as to cover the substrate 1 above which the oxide semiconductor layer 4 is formed. The channel protection layer material 11' has the three-layer structure consisting of a silicon oxide film, an aluminum oxide film, a silicon nitride film that are layered in this order. The silicon oxide film constituting a first channel protection layer material 11a' is formed for example by the plasma CVD method or the like. The silicon oxide film has film thickness of approximately 50 nm to 200 nm for example. The aluminum oxide film constituting a second channel protection layer material 11b' is layered for example by the sputtering method using the reactive sputtering device. The aluminum oxide film has film thickness of approximately 3 nm to 50 nm for example. The silicon oxide film constituting a third channel protection layer material 11c' is formed for example by the plasma CVD method or the like. The silicon oxide film has film thickness of approximately 50 nm to 200 nm for example. The channel protection layer 11 should preferably have total film thickness of approximately 100 nm to 400 nm in consideration of the short between wirings, the level difference, and so on.

Figure 20A:
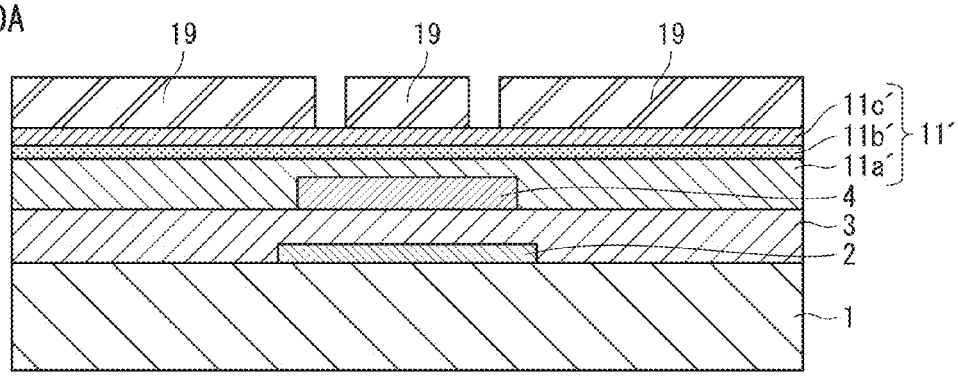
FIG. 20A to FIG. 20C are cross-sectional views schematically showing a process of layering resist on the protection layer material, a process of forming a channel protection layer in which contact holes are provided, and a process of forming a source electrode and a drain electrode, respectively, in the manufacturing method of the thin-film semiconductor device relating to Embodiment 2 of the present invention.

As shown in FIG. 20A, a resist 19 in which an opening is provided above the oxide semiconductor layer 4 is formed, on the channel protection layer material 11'. The resist 19 is formed in the same manner as the resist 9, which is shown in FIG. 3C explaining the manufacturing process of the thin-film semiconductor device 10.

Figure 20B:
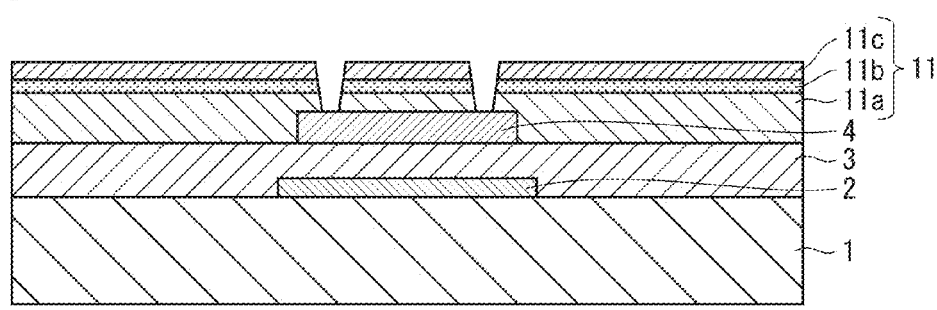

Next, as shown in FIG. 20B, a channel protection layer 11 is formed in which contact holes are provided, above the oxide semiconductor layer 4. Specifically, in the same manner as the manufacturing process shown in FIG. 4A, the layers constituting the channel protection layer 11 are etched by the dry etching method or the wet etching method. As a result, the contact holes are provided.

Figure 20C:
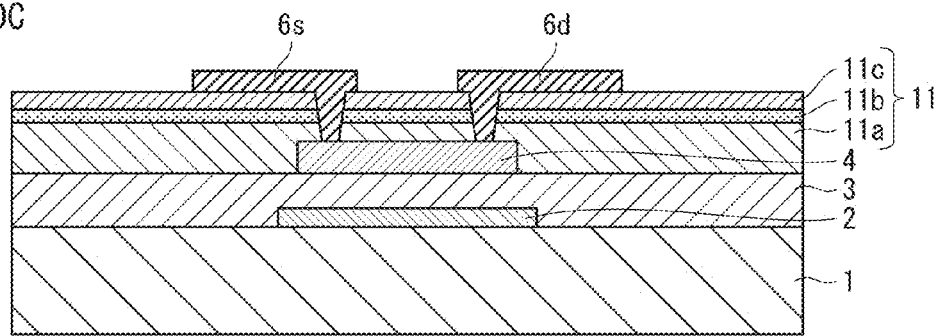

As shown in FIG. 20C, in the same manner as in FIG. 3A, a source electrode 6s and a drain electrode 6d are formed on the channel protection layer 11.

Figure 21A:
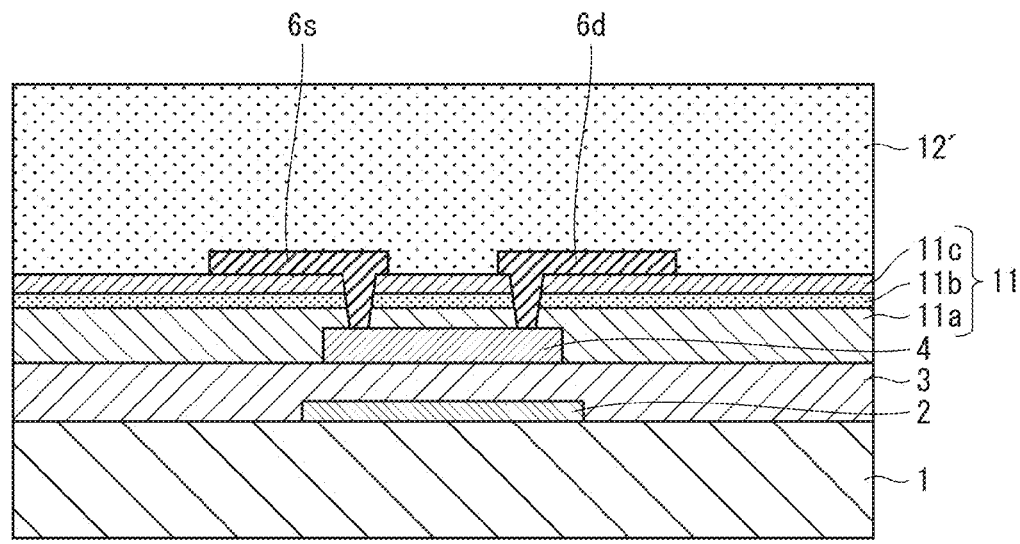
FIG. 21A and FIG. 21B are cross-sectional views schematically showing a process of layering a protection layer material and a process of forming extraction electrodes, respectively, in the manufacturing method of the thin-film semiconductor device relating to Embodiment 2 of the present invention.

As shown in FIG. 21A, a protection layer material 12' is layered so as to cover the source electrode 6s and the drain electrode 6d. For example, a silicon nitride film is formed by the plasma CVD method or the like so as to cover the source electrode 6s and the drain electrode 6d. The source electrode 6s and the drain electrode 6d each have film thickness of approximately 50 nm to 500 nm for example.

Figure 21B:
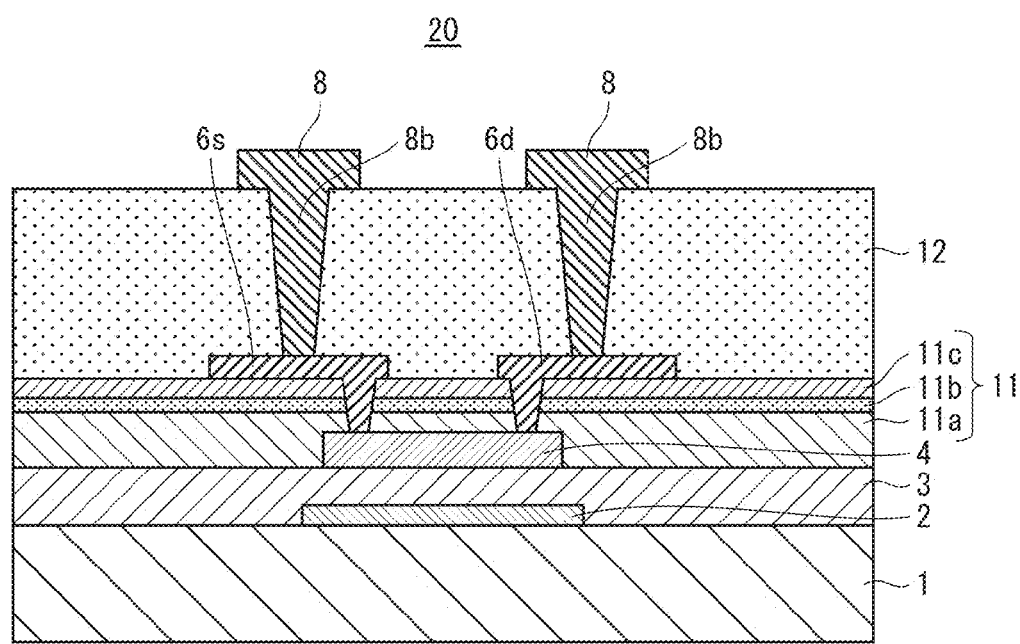

Finally, as shown in FIG. 21B, in the same manner as in FIG. 21B, extraction electrodes 8 are formed on the protection layer 12.

<Effects>

According to the thin-film semiconductor device 20, the channel protection layer 11 that includes, as the second channel protection layer 11b, an aluminum oxide film having film density of 2.80 g/cm$^3$ to 3.25 g/cm$^3$, like the second protection layer 7b of the thin-film semiconductor device 10. This prevents intrusion of hydrogen into the oxide semiconductor layer 4 and also improves the workability. Furthermore, since the use of the second channel protection layer 11b ensures an appropriate etching rate, it is possible to realize a manufacturing method with mass productivity of the thin-film semiconductor device 20.

Embodiment 3

The following describes a thin-film semiconductor device 30 relating to Embodiment 3 of the present invention and a manufacturing method of the thin-film semiconductor device 30.

<Configuration of Thin-Film Semiconductor Device 30>

Figure 22:
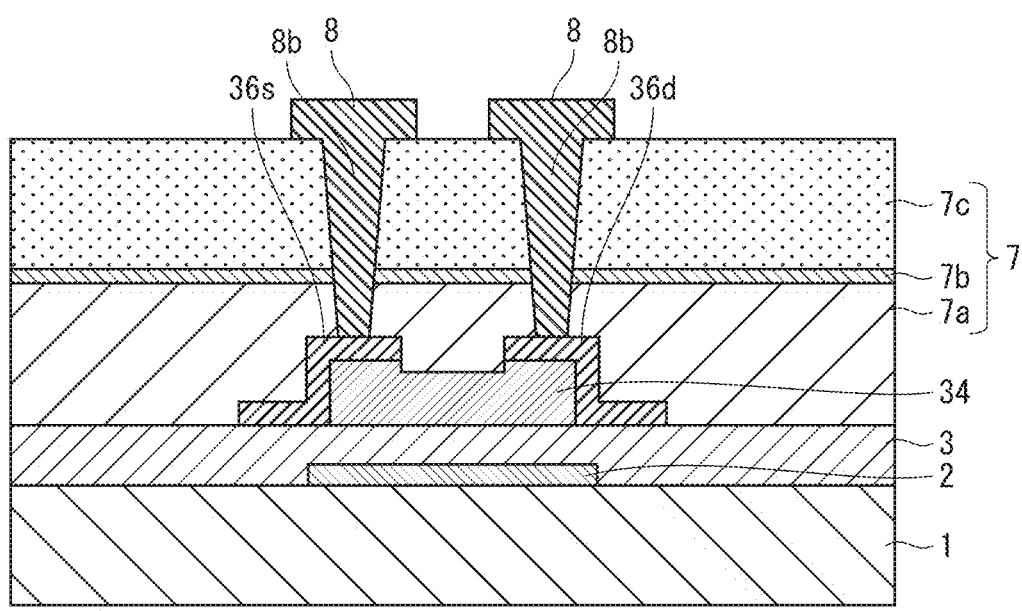
FIG. 22 is a cross-sectional view schematically showing configuration of a thin-film semiconductor device relating to Embodiment 3 of the present invention.

In Embodiment 3, as a second protection layer 7b of a protection layer 7, an aluminum oxide film that is the same as that shown in Embodiment 1 is used. On the other hand, the thin-film semiconductor device 30 is a channel etching type TFT, and this is difference from the thin-film semiconductor device 10 shown in FIG. 1. FIG. 22 is a cross-sectional view schematically showing configuration of the thin-film semiconductor device 30. In the figure, the compositional elements that are the same as the compositional elements in FIG. 1 have the same reference signs.

A surface of a part of an oxide semiconductor layer 34 that is exposed from a source electrode 36s and a drain electrode 36d is more recessed than a surface of other part of the oxide semiconductor layer 34 that is not exposed. In this way, the thin-film semiconductor device 30 is a channel etching type TFT. Since the thin-film semiconductor device 30 is of a channel etching type, a channel protection layer is not necessary and this simplifies the manufacturing process.

With the configuration of the thin-film semiconductor device 30 which is even of a channel etching type, it is possible to prevent intrusion of hydrogen into the oxide semiconductor layer 34 and also improve the workability.

Embodiment 4

The following describes a thin-film semiconductor device 40 relating to Embodiment 4 of the present invention and a manufacturing method of the thin-film semiconductor device 40.

<Configuration of Thin-Film Semiconductor Device 40>

Figure 23:
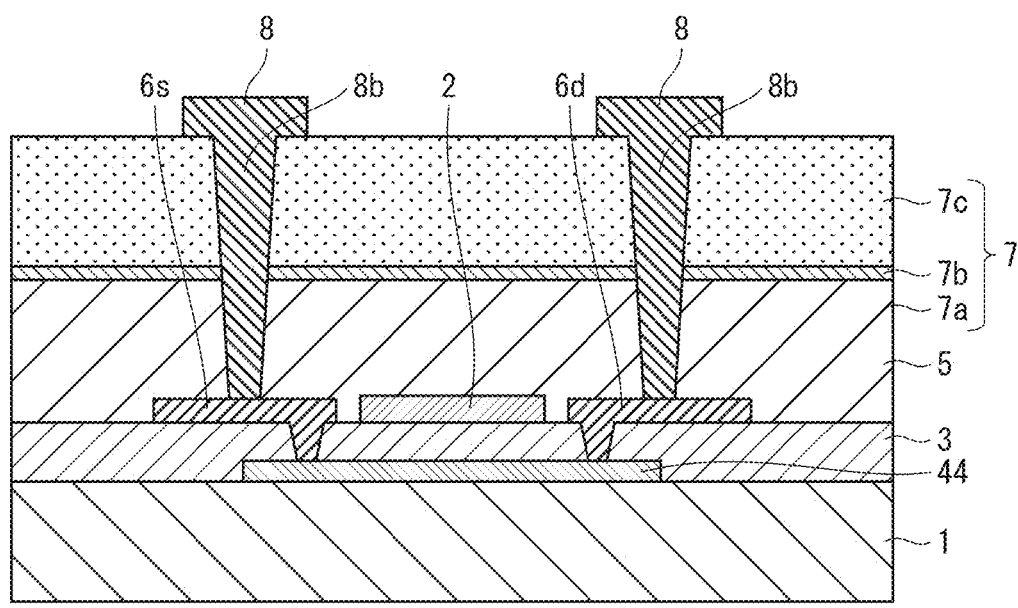
FIG. 23 is a cross-sectional view schematically showing configuration of a thin-film semiconductor device relating to Embodiment 4 of the present invention.

FIG. 23 is a cross-sectional view schematically showing configuration of the thin-film semiconductor device 40. In Embodiment 4, as a second protection layer 7b of a protection layer 7, an aluminum oxide film that is the same as that shown in Embodiment 1 is used. On the other hand, the thin-film semiconductor device 40 is a top gate type TFT, and this is difference from the thin-film semiconductor device 10 shown in FIG. 1. In the figure, the compositional elements that are the same as the compositional elements in FIG. 1 have the same reference signs.

A gate electrode 2 is formed above an oxide semiconductor layer 44. Accordingly, most part of a channel region of the oxide semiconductor layer 44 is covered with the gate electrode 2. In this way, the thin-film semiconductor device 40 is a top gate type TFT. Since the thin-film semiconductor device 40 is of a top gate type, most part of the channel region is covered with the gate electrode 2 and this suppresses variation in resistance of the oxide semiconductor layer 44.

With the configuration of the thin-film semiconductor device 40 which is even of a top gate type, it is possible to prevent intrusion of hydrogen into the oxide semiconductor layer 44 and also improve the workability.

Embodiment 5

The following describes a display device relating to Embodiment 5 of the present invention. The present embodiment is an example in which the thin-film semiconductor device 10 relating to the above Embodiment 1 is applied to a display device. In the present embodiment, description is given on an example in which the thin-film semiconductor device 10 is applied to an organic EL display device.

Figure 24:
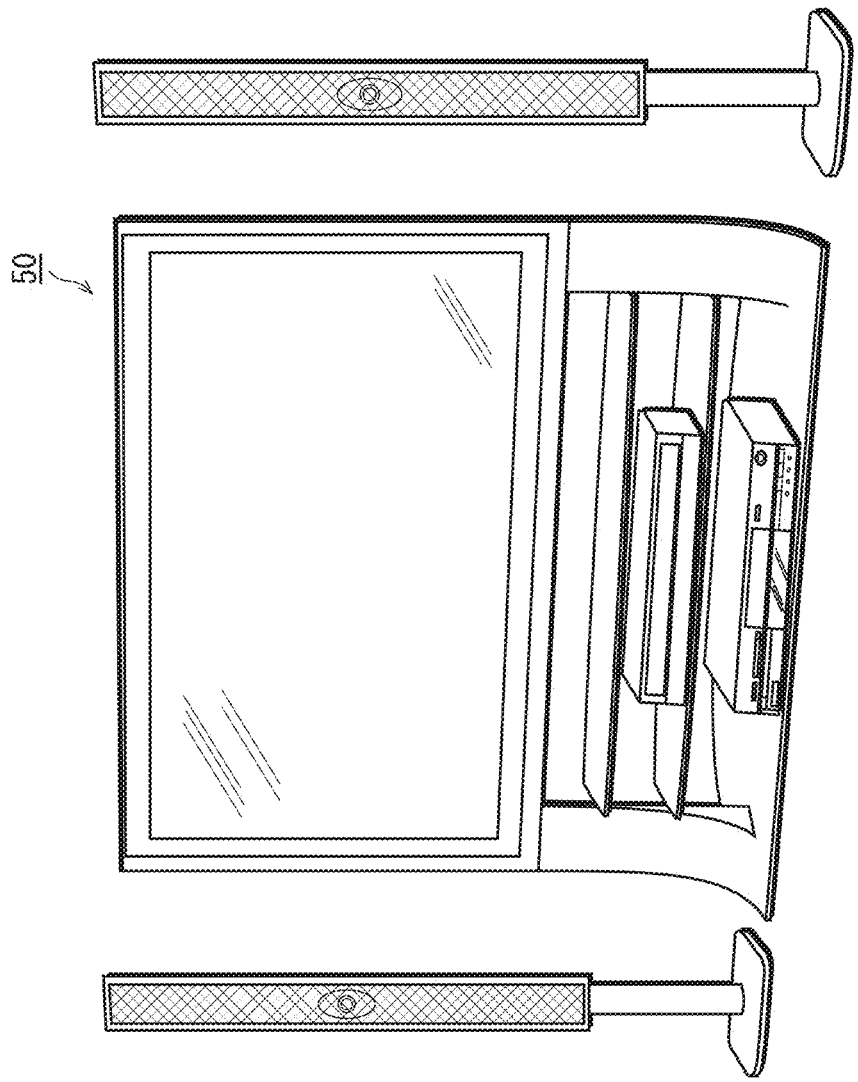
FIG. 24 shows outer appearance of an organic EL display device using the thin-film semiconductor device relating to Embodiment 1 of the present invention.

FIG. 24 illustrates outer appearance of an organic EL display device 50 using the thin-film semiconductor device 10.

Figure 25:
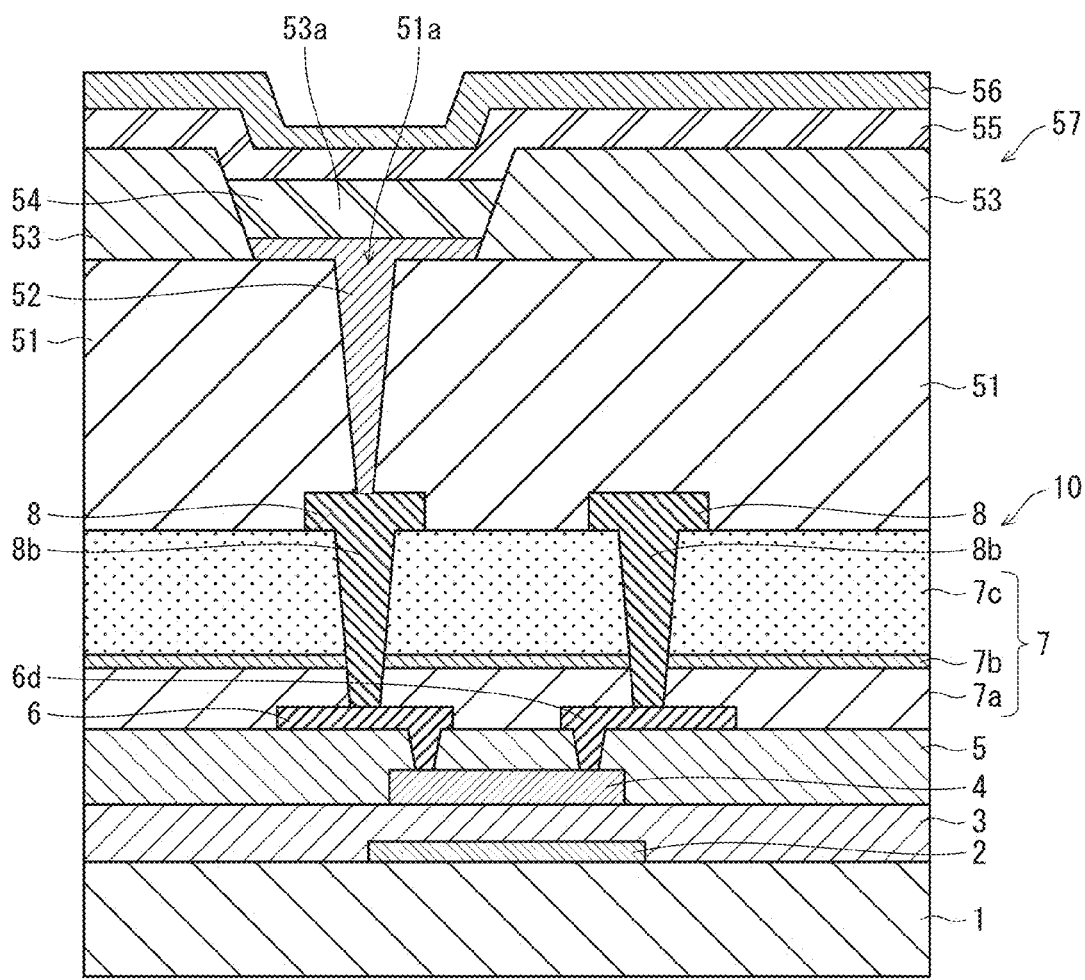
FIG. 25 is a cross-sectional view schematically showing one pixel of the organic EL display device using the thin-film semiconductor device relating to Embodiment 1 of the present invention.

Also, FIG. 25 is a cross-sectional view schematically showing the organic EL display device 50. Although the organic EL display device 50 actually includes a plurality of pixels, only one pixel is shown in the figure. The organic EL display device 50 is of an active matrix driving type, and the thin-film semiconductor device 10 is used as a drive transistor.

The organic EL display device 50 includes the thin-film semiconductor device 10, an insulating layer 51, a lower electrode 52, a barrier rib layer 53, an organic EL layer 54, an upper electrode 55 (light-transmissive electrode), and a passivation layer 56. The insulating layer 51 has provided therein a contact hole 51a in which a lower part of the lower electrode 52 is embedded. The lower electrode 52 is electrically connected with the source electrode 6s via the extraction electrode 8. The barrier rib layer 53 has provided therein an opening 53a in which the organic EL layer 54 is embedded. The organic EL layer 54 includes a light-emitting layer containing an organic light emitting material. The organic EL layer 54 may further include an electron transport layer, a hole transport layer, and so on. The upper electrode 55 is formed all over the pixels so as to cover the organic EL layer 54. The passivation layer 56 is formed all over the pixels so as to cover the upper electrode 55. The insulating layer 51, the lower electrode 52, the barrier rib layer 53, the organic EL layer 54, the upper electrode 55, and the passivation layer 56 are referred to collectively as an organic EL element 57.

Figure 26:
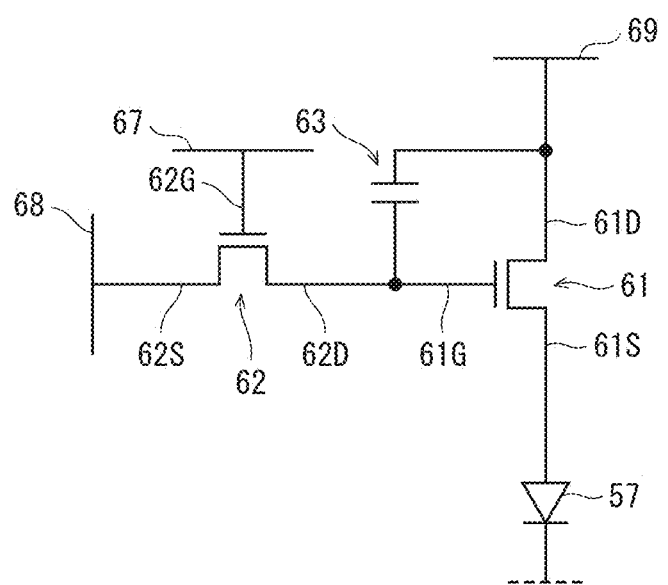
FIG. 26 shows circuit configuration of one pixel of the organic EL display device using the thin-film semiconductor device relating to Embodiment 1.

The following describes circuit configuration of one pixel of the organic EL display device 50 with reference to FIG. 26. FIG. 26 shows the circuit configuration of one pixel of the organic EL display device 50 using the thin-film semiconductor device 10 relating to Embodiment 1. Here, the thin-film semiconductor device 10 is referred to as a drive transistor 61. An anode and a cathode of the organic EL element 57 respectively correspond to the lower electrode 52 and the upper electrode 55 shown in FIG. 25.

In each pixel, there exist the organic EL element 57, the drive transistor 61, a switching transistor 62, and a capacitor 63. The drive transistor 61 is a transistor for driving the organic EL element 57. The switching transistor 62 is a transistor for selecting a pixel.

In the drive transistor 61, a gate electrode 61G is connected with a drain electrode 62D of the switching transistor 62, a source electrode 61S is connected with the anode of the organic EL element 57, a drain electrode 61D is connected with a power line 69.

Also, in the switching transistor 62, a gate electrode 62G is connected with a selection line 67, a source electrode 62S is connected with a selection line 68, and a drain electrode 62D is connected with the capacitor 63 and the gate electrode 61G of the drive transistor 61.

With this configuration, when the switching transistor 62 is turned on in response to an input of a gate signal to the selection line 67, a video signal voltage which is supplied via the selection line 68 is applied to the capacitor 63. The video signal voltage applied to the capacitor 63 is held for one frame period. Conductance of the drive transistor 61 varies in an analog manner due to the held video signal voltage, and driving current corresponding to the video signal voltage flows from the anode to the cathode of the organic EL element 57 to cause the organic EL element 57 to emit light. As a result, images are displayed on the organic EL display device 50.

Although the organic EL display device 50 has been described, the display device relating to Embodiment 5 is not limited to this. The thin-film semiconductor device 10 may be used as a switching transistor instead of as a drive transistor. Also, Embodiment 5 may be a display device that includes other display element using an active matrix substrate such as a liquid crystal display element. Such a display device is applicable to any electric equipment having display devices such as television sets, personal computers, and mobile phones.

<Modifications>

Although the description has been given on the thin-film semiconductor device relating to the present invention and the manufacturing method thereof based on the above embodiments, the present invention is not limited by the above embodiments. For example, the present invention also includes an embodiment obtained through various types of modifications which could be conceived of by one skilled in the art to the above embodiments, an embodiment obtained through any combination of the compositional elements and the functions in the above embodiments without departing from the spirit of the present invention, and so on.

<Substrate>

In the above embodiments and so on, a glass substrate is used as the substrate. However, the substrate is not limited to a glass substrate, and alternatively a plastic substrate or the like may be used for example. Also, the substrate is made of material through which hydrogen passes, a hydrogen protection film should be provided between the substrate and the oxide semiconductor layer.

Note that in the case where an undercoat layer is formed using silicon nitride or the like on the substrate, a hydrogen protection film should be formed between the substrate and the oxide semiconductor layer in order to prevent intrusion of hydrogen into the oxide semiconductor layer.

<Thin-Film Semiconductor Device>

In the above embodiments and so on, the description has been given using a TFT as an example of the thin-film semiconductor device. However, there is no limitation to this, and the thin-film semiconductor device of the present invention may be any thin-film semiconductor device that includes an oxide semiconductor layer between a substrate and a film containing aluminum oxide having through-holes provided therein. The present invention is for example applicable to a thin-film solar battery that is composed of an oxide semiconductor layer sandwiched between two electrodes, and so on.

INDUSTRIAL APPLICABILITY

The thin-film semiconductor device relating to the present invention is widely utilizable for various types of electric equipment including display devices such as television sets, personal computers, and mobile phones, and other thin-film semiconductor devices.

REFERENCE SIGNS LIST 1 substrate
2 gate electrode
3 gate insulating film
4 oxide semiconductor layer
5, 11 channel protection layer
6s source electrode
6d drain electrode
7, 12 protection layer
7a first protection layer
7b second protection layer
7c third protection layer
8 extraction electrode
10, 20, 30, 40 thin-film semiconductor device
11a first channel protection layer
11b second channel protection layer
11c third channel protection layer
50 organic EL display device
51 insulating layer
52 lower electrode
53 barrier rib layer
54 organic EL layer
55 upper electrode
56 passivation layer
61 drive transistor
62 switching transistor
64 capacitor
67 signal line
68 selection line
69 power line

The invention claimed is:

1. A thin-film semiconductor device, comprising:
   a substrate;
   a film containing aluminum oxide;
   an oxide semiconductor layer between the substrate and the film containing aluminum oxide;
   a film containing silicon oxide between the oxide semiconductor layer and the film containing aluminum oxide; and
   a film containing silicon nitride opposite to the oxide semiconductor layer with the film containing silicon oxide and the film containing aluminum oxide interposed between the oxide semiconductor layer and the film containing silicon nitride, wherein
   each of the film containing aluminum oxide, the film containing silicon oxide, and the film containing silicon nitride includes at least one through-hole in which an extraction electrode is embedded, the extraction electrode being electrically connected with the oxide semiconductor layer,
   when the substrate is viewed in a plan view, the through-hole included in each of the film containing aluminum oxide, the film containing silicon oxide, and the film containing silicon nitride overlap, and
   the film containing aluminum oxide has a film density of 2.80 g/cm$^3$ to 3.25 g/cm$^3$.

2. The thin-film semiconductor device of claim 1, wherein the film containing aluminum oxide has the film density of 2.85 g/cm$^3$ to 2.95 g/cm$^3$.

3. The thin-film semiconductor device of claim 1, wherein a composition ratio x of oxygen to aluminum in the film containing aluminum oxide satisfies 1.5<x<2.0.

4. The thin-film semiconductor device of claim 3, wherein the composition ratio x satisfies 1.79≤x≤1.85.

5. The thin-film semiconductor device of claim 1, wherein aluminum oxide contained in the film containing aluminum oxide has an amorphous structure.

6. The thin-film semiconductor device of claim 1, wherein the film containing aluminum oxide has a refractive index of 1.58 to 1.66.

7. The thin-film semiconductor device of claim 1, wherein the film containing aluminum oxide has a film thickness of 3 nm to 30 nm.

8. The thin-film semiconductor device of claim 1, wherein the film containing aluminum oxide has a single-layer structure.

9. An organic EL display device, comprising:
   the thin-film semiconductor device of claim 1; and
   above the film containing aluminum oxide of the thin-film semiconductor device of claim 1, an organic EL element that includes:
   a lower electrode that is electrically connected with the extraction electrode;
   a light-emitting layer containing an organic light-emitting material; and
   an upper electrode.

10. The thin-film semiconductor device of claim 1, wherein
   the film containing aluminum oxide has a film thickness of 3 nm to 50 nm,
   the film containing silicon oxide has a film thickness of 50 nm to 500 nm, and
   the film containing silicon nitride has a film thickness of 50 nm to 700 nm.

11. The thin-film semiconductor device of claim 1, wherein
a total thickness of the film containing aluminum oxide, the film containing silicon oxide, and the film containing silicon nitride is 300 nm to 700 nm.

12. A manufacturing method of a thin-film semiconductor device, the manufacturing method comprising:
preparing a substrate;
forming an oxide semiconductor layer above the substrate;
forming a film containing silicon oxide above the oxide semiconductor layer;
forming a film containing aluminum oxide above the film containing silicon oxide, the film containing silicon oxide being between the oxide semiconductor layer and the film containing aluminum oxide;
forming a film containing silicon nitride above the film containing aluminum oxide, the film containing silicon nitride being opposite to the oxide semiconductor layer with the film containing silicon oxide and the film containing aluminum oxide interposed between the oxide semiconductor layer and the film containing silicon nitride;
providing at least one through-hole in each of the film containing aluminum oxide, the film containing silicon oxide, and the film containing silicon nitride; and
embedding, in the through-hole provided in each of the film containing aluminum oxide, the film containing silicon oxide, and the film containing silicon nitride, an extraction electrode that is to be electrically connected with the oxide semiconductor layer, wherein
when the substrate is viewed in a plan view, the through-hole provided in each of the film containing aluminum oxide, the film containing silicon oxide, and the film containing silicon nitride overlap, and
the film containing aluminum oxide has a film density of 2.80 g/cm$^3$ to 3.25 g/cm$^3$.

13. A manufacturing method of an organic EL display device, the manufacturing method comprising:
preparing a substrate;
forming an oxide semiconductor layer above the substrate;
forming a film containing silicon oxide above the oxide semiconductor layer;
forming a film containing aluminum oxide above the film containing silicon oxide, the film containing silicon oxide being between the oxide semiconductor layer and the film containing aluminum oxide;
forming a film containing silicon nitride above the film containing aluminum oxide, the film containing silicon nitride being opposite to the oxide semiconductor layer with the film containing silicon oxide and the film containing aluminum oxide interposed between the oxide semiconductor layer and the film containing silicon nitride;
providing at least one through-hole in each of the film containing aluminum oxide, the film containing silicon oxide, and the film containing silicon nitride;
embedding, in the through-hole provided in each of the film containing aluminum oxide, the film containing silicon oxide, and the film containing silicon nitride, an extraction electrode that is to be electrically connected with the oxide semiconductor layer; and
forming an organic EL element above the film containing silicon nitride, the organic EL element including a lower electrode that is to be electrically connected with the extraction electrode, a light-emitting layer containing an organic light-emitting material, and an upper electrode, wherein
when the substrate is viewed in a plan view, the through-hole provided in each of the film containing aluminum oxide, the film containing silicon oxide, and the film containing silicon nitride overlap, and
the film containing aluminum oxide has a film density of 2.80 g/cm$^3$ to 3.25 g/cm$^3$.

* * * * *